(12) United States Patent
Chung et al.

(10) Patent No.: US 11,158,728 B2
(45) Date of Patent: Oct. 26, 2021

(54) MULTI-GATE DEVICE AND RELATED METHODS

(71) Applicant: Taiwan Semiconductor Manufacturing Co., Ltd., Hsinchu (TW)

(72) Inventors: Cheng-Ting Chung, Hsinchu (TW); Ching-Wei Tsai, Hsinchu (TW); Kuan-Lun Cheng, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/599,972

(22) Filed: Oct. 11, 2019

(65) Prior Publication Data

US 2020/0381531 A1 Dec. 3, 2020

Related U.S. Application Data

(63) Continuation of application No. 16/426,114, filed on May 30, 2019, now Pat. No. 10,879,379.

(51) Int. Cl.
*H01L 21/8234* (2006.01)
*H01L 29/66* (2006.01)
*H01L 29/49* (2006.01)
*H01L 29/417* (2006.01)
(Continued)

(52) U.S. Cl.
CPC .. *H01L 29/6681* (2013.01); *H01L 21/823431* (2013.01); *H01L 29/161* (2013.01); *H01L 29/41791* (2013.01); *H01L 29/4991* (2013.01); *H01L 29/785* (2013.01)

(58) Field of Classification Search
CPC ......... H01L 29/6681; H01L 21/823431; H01L 29/161; H01L 29/41791; H01L 29/4991; H01L 29/785; H01L 29/0669–068; H01L 29/0665; H01L 2924/13061; H01L 29/66439; H01L 29/66469; H01L 2924/13092; H01L 29/7831–7832; H01L 29/66484; H01L 21/823437–823456; H01L 29/66795–66818; H01L 29/0649–0653
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |

(Continued)

FOREIGN PATENT DOCUMENTS

| | | |
|---|---|---|
| KR | 20080098894 A | 11/2008 |
| KR | 20190024535 A | 3/2019 |

*Primary Examiner* — Shahed Ahmed
(74) *Attorney, Agent, or Firm* — Haynes and Boone, LLP

(57) ABSTRACT

Multi-gate semiconductor devices and methods for forming thereof including forming air gaps between the gate and the adjacent source/drain features. A first fin element including a plurality of silicon layers is disposed on a substrate, a first gate structure is formed over a channel region of the first fin element. An air gap is formed such that it is disposed on a sidewall of the portion of the first gate structure. An epitaxial source/drain feature abuts the air gap. A portion of the first gate structure may also be disposed between first and second layers of the plurality of silicon layers.

20 Claims, 22 Drawing Sheets

(51) Int. Cl.
*H01L 29/78* (2006.01)
*H01L 29/161* (2006.01)

(56) References Cited

U.S. PATENT DOCUMENTS

| | | | |
|---|---|---|---|
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2017/0154968 | A1 | 6/2017 | Park et al. |
| 2017/0200738 | A1 | 7/2017 | Kim et al. |
| 2018/0047617 | A1* | 2/2018 | Cheng et al. |
| 2019/0123189 | A1* | 4/2019 | Chen .................. H01L 21/8221 |
| 2019/0157414 | A1 | 5/2019 | Ando et al. |
| 2019/0157444 | A1* | 5/2019 | Yang .................. H01L 29/6681 |
| 2020/0152504 | A1* | 5/2020 | Frougier ............. H01L 29/4991 |
| 2020/0381427 | A1* | 12/2020 | Suh ................. H01L 21/823412 |

\* cited by examiner

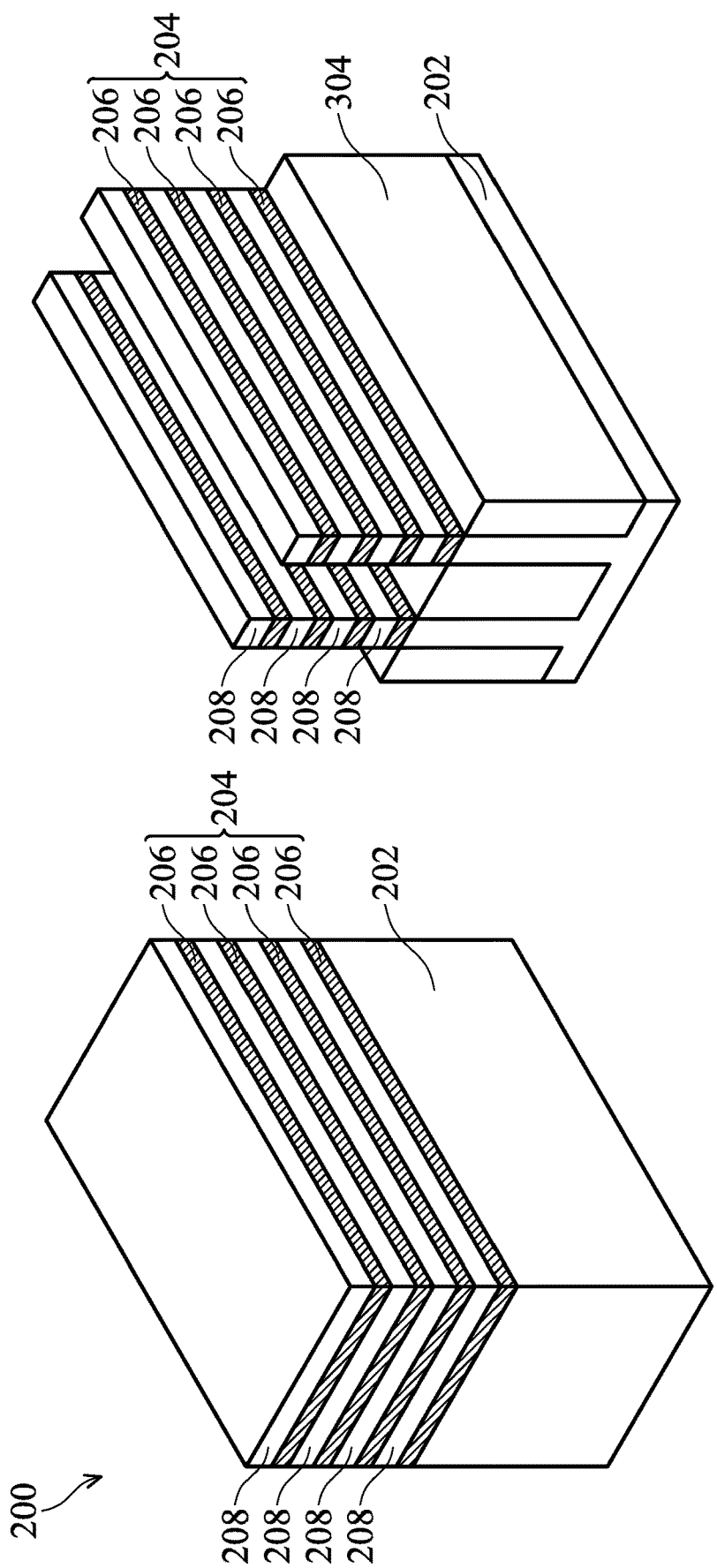

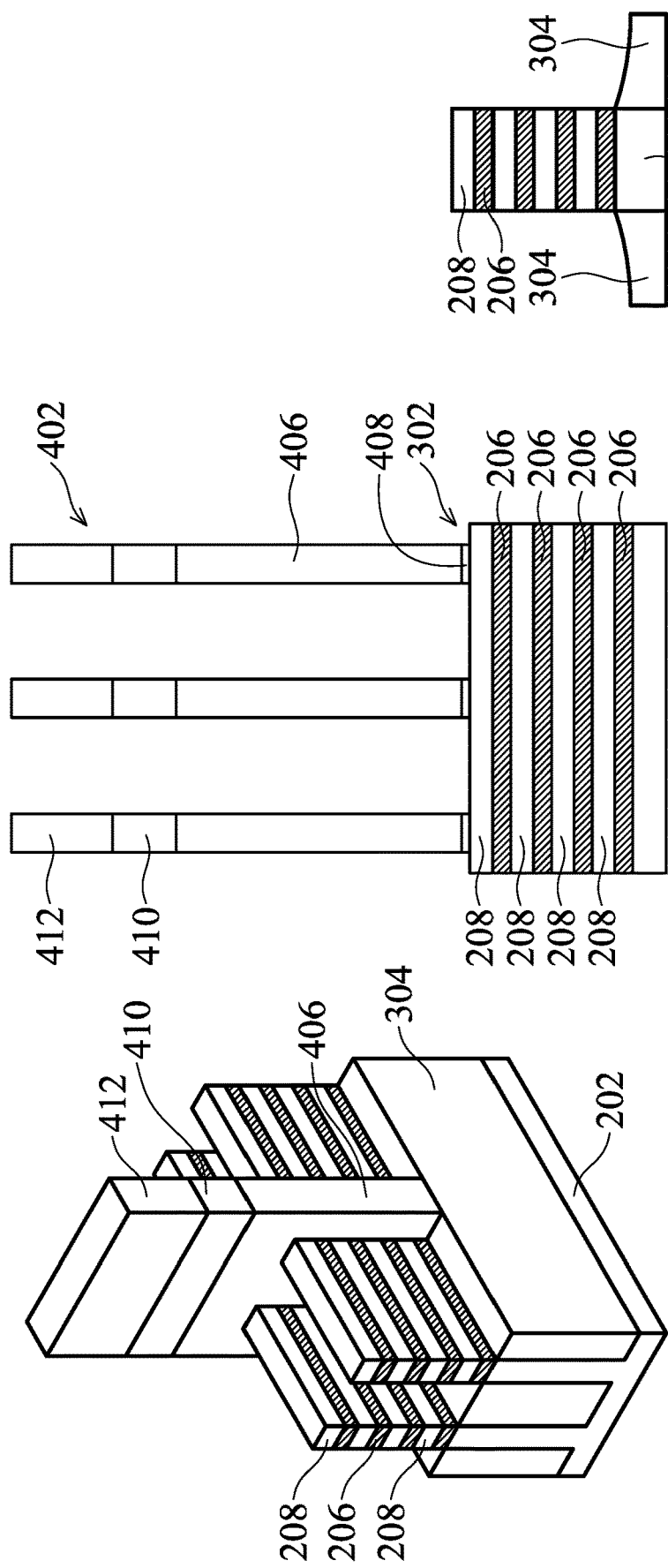

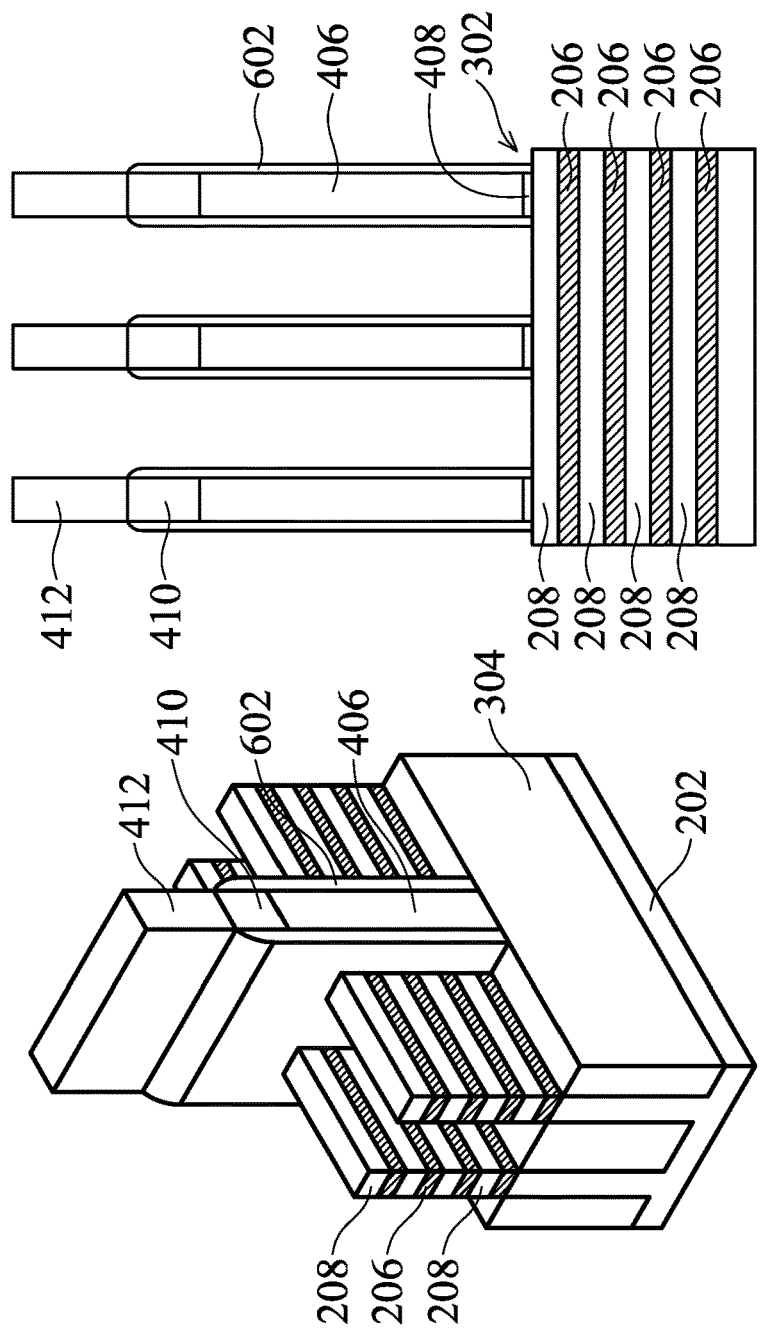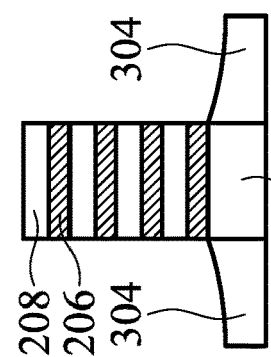

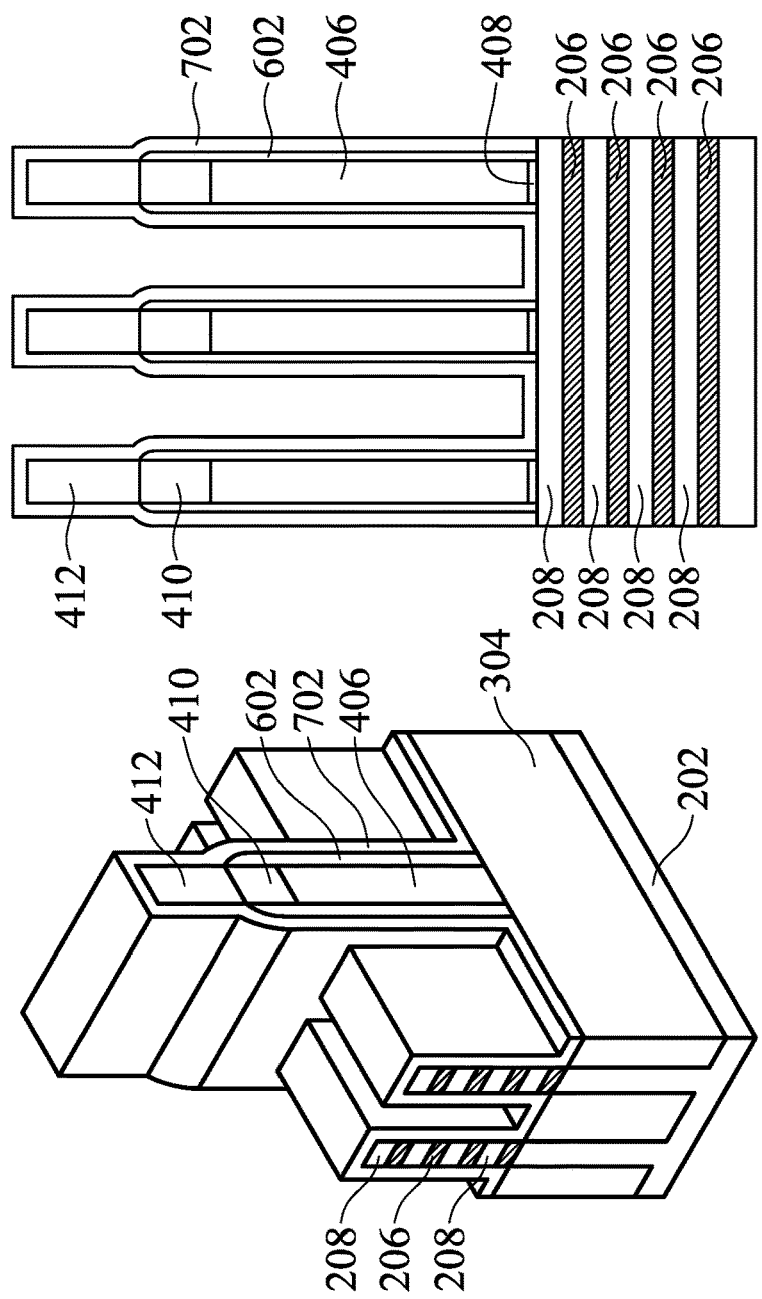

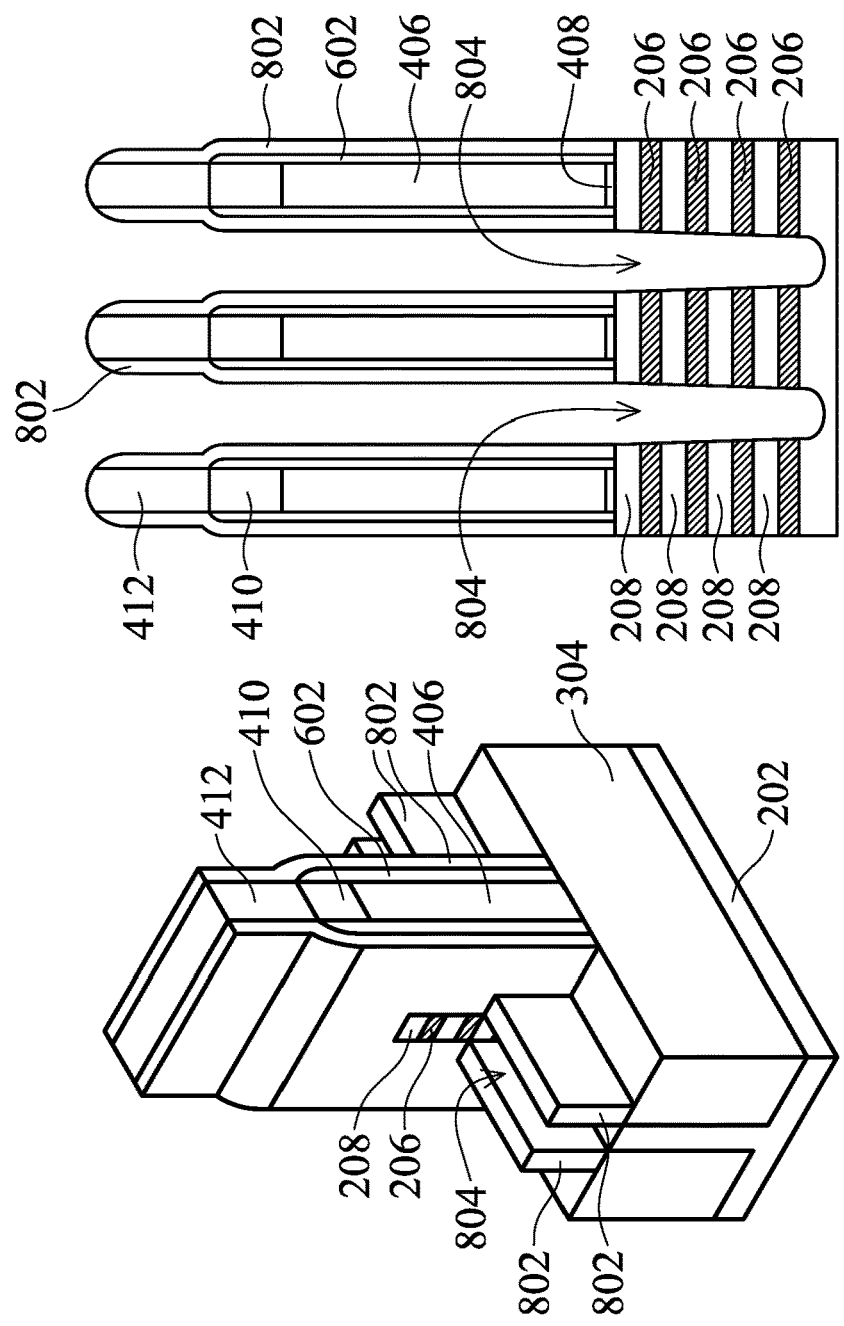

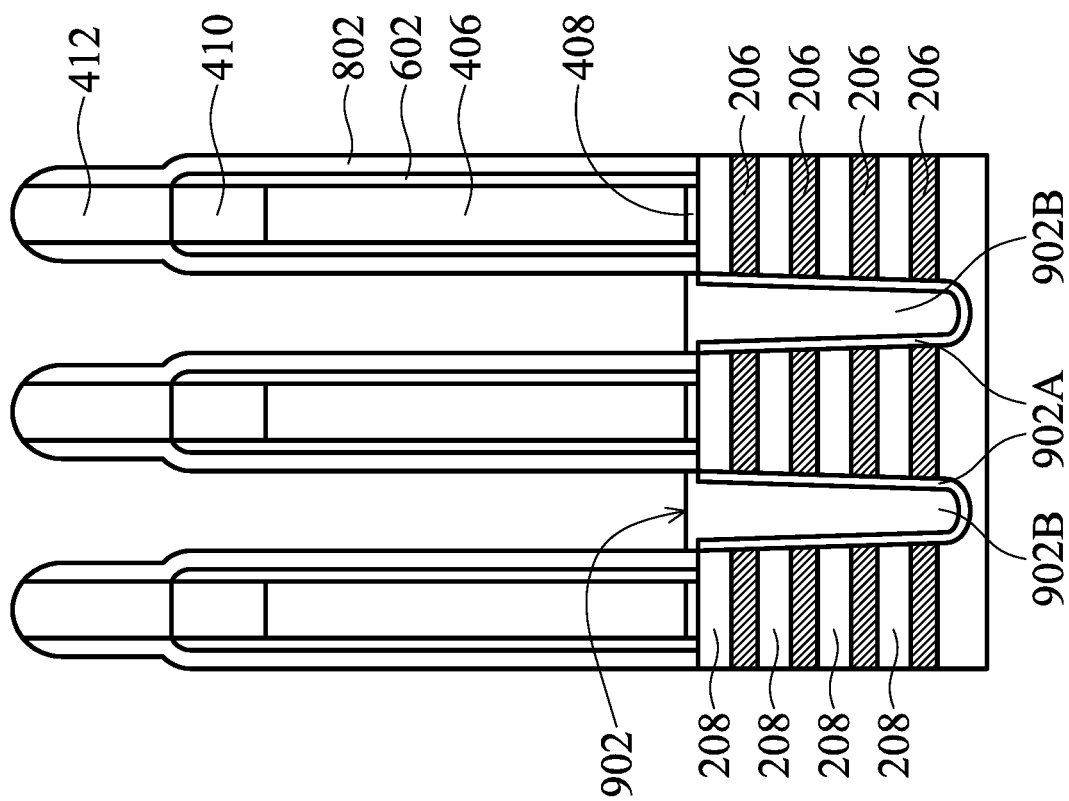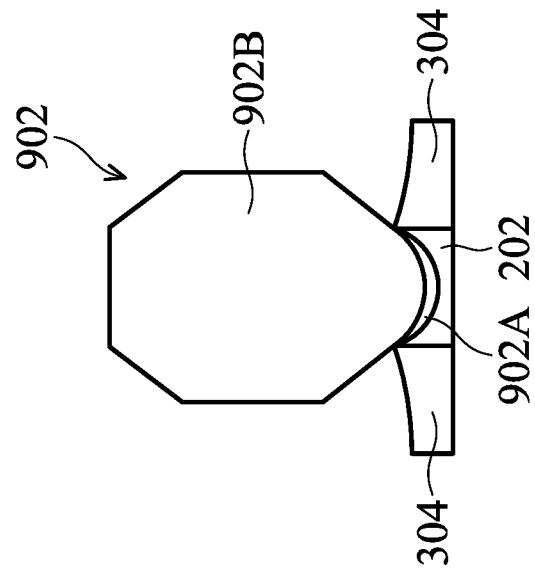

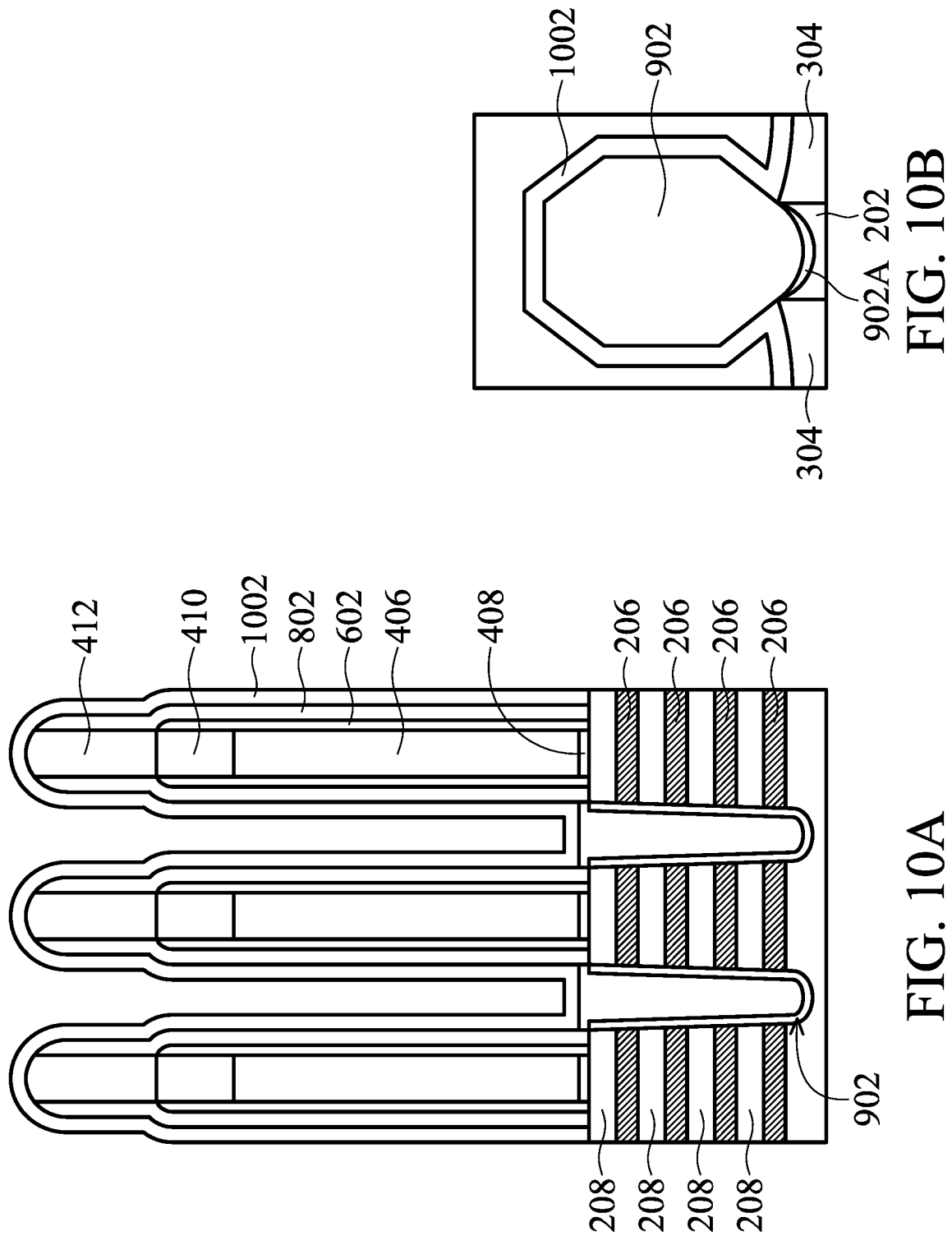

MULTI-GATE DEVICE AND RELATED METHODS

CROSS-REFERENCE TO RELATED APPLICATION

This application is a continuation of U.S. patent application Ser. No. 16/426,114, filed May 30, 2019, the disclosure of which is herein incorporated by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. A further type of multi-gate device, introduced in part to address performance challenges associated with some configurations of FinFETs, is the gate-all-around (GAA) transistor. GAA devices get their name from the gate structure which extends completely around the channel, providing better electrostatic control than FinFETs. GAA devices and processes of fabricating thereof are compatible with conventional complementary metal-oxide-semiconductor (CMOS) processes and their three-dimensional structure allows them to be aggressively scaled while maintaining gate control and mitigating SCEs. In general, GAA devices may be implemented, for example, in cases where FinFETs can no longer meet performance requirements. However, GAA device fabrication can be challenging, and current methods continue to face challenges with respect to both device fabrication and performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, 5A, 6A, 7A, 8A, 9A, 10A, 11A, 12A, 13A, 14A, 15A, 16A, 17A, 18A and 19A are isometric views of an embodiment of a device 200 according to aspects of an embodiment of the method of FIG. 1;

FIGS. 4B, 4C, 5B, 5C, 6B, 6C, 7B, 7C, 8B, 8C, 9B, 9C, 9D, 9E, 10B, 11B, 11C, 12B, 13B, 14B, 15B, 16B, 17B, 18B, and 19B are cross-sectional views of an embodiment of a device 200 according to aspects of the method of FIG. 1.

DETAILED DESCRIPTION

Figure 1:
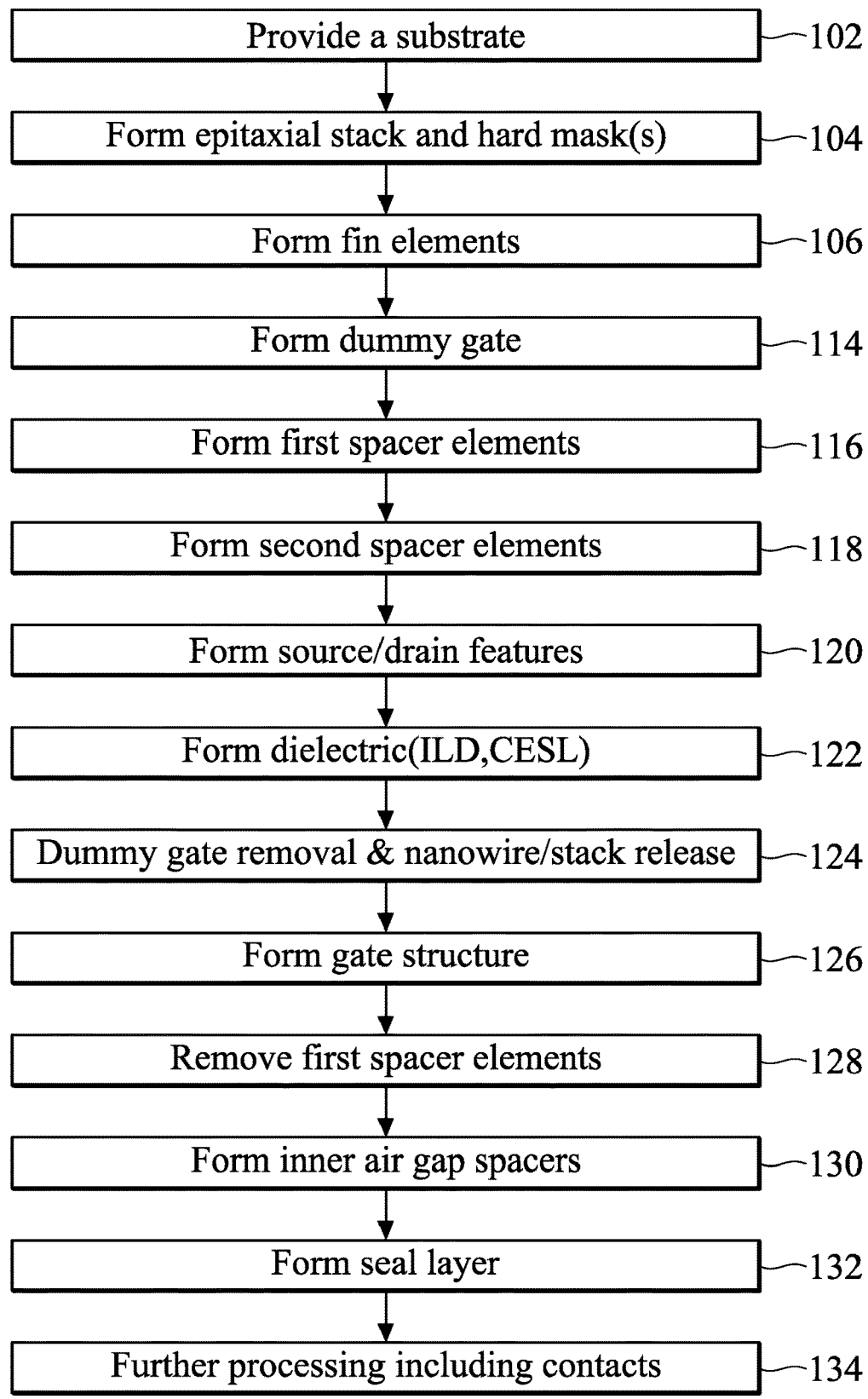
FIG. 1 is a flow chart of a method of fabricating a multi-gate device or portion provided according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires, nano-sheets) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for improving performance and fabrication of GAA devices. Generally, some of the key process challenges of at least some current methods include Si or SiGe nanowire/nano sheet formation, air gaps forming an inner spacer/main spacer, and metal gate (MG) structures. Problems associated with the inner spacer (e.g., defects/voids in the source/drain epitaxial layer), in particular, are addressed to enhance device performance. In accordance with some embodiments of the present disclosure, a process flow and device structure are provided that include a nanowire or nanosheet device for N-type devices (NFETs) or for P-type devices (PFETS). In some embodiments, both NFET and PFET devices on a substrate may include nanowire or nanosheet devices including those fabricated according to aspects of FIG. 1 below. In particular, aspects of the present disclosure provide devices and methods of forming thereof that provide for air gaps as inner spacer elements for GAA devices. The air gaps can suitable isolation, while also providing for a fabrication method that allows for a more conducive environment for source/drain formation. Other embodiments and advantages will be evident to those skilled in the art upon reading the present disclosure.

Illustrated in FIG. 1 is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped, sheet-shaped) and various dimensions. It is understood that the method 100 includes steps having features of a complementary metal-oxide-semiconductor (CMOS) technology process flow and thus, are only described briefly herein. Additional steps may be performed before, after, and/or during the method 100.

FIGS. 2, 3, 4A, 5A, 6A, 7A, 8A, 9A, 11A, 12A, 13A, 14A, 15A, 16A, 17A, 18A and 19A are isometric views of an embodiment of a semiconductor device 200 according to various stages of the method 100 of FIG. 1. FIGS. 4B, 5B, 6B, 7B, 8B, 9B, 9D, 10A, 11B, 12B, 13B, 14B, 15B, 16B, 17B, 18B, and 19B are cross-section views, corresponding to respective isometric views listed above, of an embodiment of the semiconductor device 200 along a first cut X-X', the first cut being parallel to a channel of the device. FIGS. 4C, 5C, 6C, 7C, 8C, 9C, 9E, 10B, and 11C are cross-section views, corresponding to respective isometric views listed above, of an embodiment of the semiconductor device 200 along a second cut Y-Y', the second cut being perpendicular to the channel of the device and in the source/drain region of the device. It is noted that the processing occurring after the illustration of exemplary FIG. 11C may continue to provide aspects illustrated in FIG. 11C in the cut direction Y-Y'.

It is understood that parts of the semiconductor device 200 may be fabricated by a CMOS technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., N wells, P wells) may be formed on the substrate 202 in regions designed for different device types. The different doping profiles may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features. In an embodiment of the method 100, in block 102, an anti-punch through (APT) region is formed on the substrate 202.

Returning to FIG. 1, the method 100 then proceeds to block 104 where one or more epitaxial layers are grown on the substrate. With reference to the example of FIG. 2, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, for example when the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of a GAA transistor of the device 200. For example, the epitaxial layers 208 may be referred to as "nanowires" used to form a channel region of a GAA device, such as an N-type GAA device or a P-type GAA, as discussed below. Again, as the term is used herein, "nanowires" refers to semiconductor layers that are cylindrical in shape as well as other configurations such as, bar-shaped or sheet-shaped. That is, as the term is used herein, "nanowires" includes "nanosheets." The use of the epitaxial layers 208 to define a channel or channels of a device is further discussed below.

It is noted that a plurality of the epitaxial layer 206 and a plurality of the epitaxial layer 208 are illustrated in FIG. 2, the illustrated number is for illustrative purposes only and not intended to be limiting beyond what is specifically recited in the claims. It can be appreciated that any number of epitaxial layers can be formed in the epitaxial stack 204; the number of layers depending on the desired number of channels regions for the GAA device. In some embodiments, the number of epitaxial layers 208 is between 2 and 10.

In some embodiments, the epitaxial layer 206 has a thickness range of about 4-8 nanometers (nm). In some embodiments, the epitaxial layers 206 may be substantially uniform in thickness. As the epitaxial layer(s) 208 may serve as channel region(s) for a subsequently-formed multi-gate device (e.g., a GAA device), its thickness chosen based on device performance considerations. The epitaxial layer 206 may serve to define a gap distance between adjacent channel region(s) for the subsequently-formed multi-gate device and its thickness chosen based on device performance considerations.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch rates, and/or etch selectivity properties. In various embodiments, the epitaxial layers 206, 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Still referring to FIG. 2, in a further embodiment of block 104, a hard mask may be formed over the epitaxial stack 204 for use in patterning the stack 204. In some embodiments, the HM layer includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique.

The method 100 then proceeds to block 106 where a photolithography and etch processes are performed to form fin elements including the epitaxial stack discussed above. Referring to the example FIG. 3, an embodiment of block 106 is illustrated including fin elements (or simply fins) 302 that are formed of the epitaxial stack 204 and the substrate 202.

That is, in various embodiments, each of the fin elements 302 includes a substrate portion formed from the substrate 202, and portions of each of the epitaxial layers of the epitaxial stack 204 including epitaxial layers 206 and 208. The fin elements 302 may be fabricated using suitable processes including photolithography and etch processes. The photolithography process may include forming a photoresist layer over the substrate 202 (e.g., over the device 200 of FIG. 2), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process (i) forms trenches in unprotected regions through the epitaxial layers 206, 208 and into the substrate 202. The trenches may be etched using a dry etch (e.g., reactive ion etching), a wet etch, and/or other suitable processes. In various embodiments, the trenches may be filled with a dielectric material forming, for example, shallow trench isolation (STI) features interposing the fins. The STI features 304 are illustrated in FIG. 3.

In some embodiments, the dielectric layer used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process. In some embodiments, after deposition of the dielectric layer, the device 200 may be annealed, for example, to improve the quality of the dielectric layer. In some embodiments, the STI features 304 may include a multi-layer structure, for example, having one or more liner layers.

In some embodiments of forming the isolation (STI) features, after deposition of the dielectric layer, the deposited dielectric material is thinned and planarized, for example by a CMP process. The CMP process may planarize the top surface of the device 200 to form the STI features 304. In various embodiments, the STI features 304 interposing the fin elements 302 are then recessed. Referring to the example of FIG. 3, the STI features 304 recessed such that the fins 302 extend above the STI features 304. In some embodiments, the recessing process may include a dry etching process, a wet etching process, and/or a combination thereof. In some embodiments, a recessing depth is controlled (e.g., by controlling an etching time) to result in a desired height of the exposed upper portion of the fin elements 302. In some embodiments, the height exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin elements. In some embodiments, forming the fins may include a trim process to decrease the width of the fins. The trim process may include wet or dry etching processes.

The method 100 then proceeds to block 114 where a dummy gate structure, which provides sacrificial layers/features, is formed on the substrate. With reference to FIGS. 4A, 4B, and 4C, in an embodiment of block 114, a gate stack 402 is formed over the fin elements 302. In an embodiment, the gate stacks 402 are dummy (sacrificial) gate stacks that are subsequently removed as discussed below.

The gate stacks 402 may also define a source/drain region of the fin elements 302 for example, the regions of the fin elements adjacent to and on opposing sides of the channel region that underlies the gate stacks 402. FIG. 4A illustrates the X-X' and Y-Y' cross-sectional cuts that correspond to FIG. 4B and FIG. 4C respectively. It is noted that FIG. 4A is illustrative of a portion of the device 200 including a single gate stack 402, however any number of gate stacks 402 may be formed.

In some embodiments, the gate stacks 402 include a dielectric layer 408 and an electrode layer 406. One or more hard mask layers 410/412 may be disposed over the gate stack 402. In some embodiments, the hard mask layer 410/412 includes an oxide layer 410 and the hard mask layer 412 is a nitride layer. In some embodiments, the gate stacks 402 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 408 includes silicon oxide. Alternatively, or additionally, the dielectric layer 408 may include silicon nitride, a high-K dielectric material or other suitable material. In some embodiments, the electrode layer 406 of the gate stacks 402 may include polycrystalline silicon (polysilicon). In some embodiments, the oxide of the hard mask layer 410 includes a pad oxide layer that may include $SiO_2$. In some embodiments, the nitride of the hard mask layer 412 includes a pad nitride layer that may include $Si_3N_4$, silicon oxynitride or silicon carbide.

The method 100 then proceeds to block 116 where a first spacer material layer is deposited on the substrate. The spacer material layer may be a conformal layer that is subsequently etched back to form spacer elements on sidewalls of the gate stacks. The spacer material layer is a suitable dielectric composition. Example compositions include SiOC, SiO2, SiN, SiOCN, SiON, or other suitable materials. In an embodiment, the first spacer material layer may include amorphous silicon. The first spacer may also be referred to as a disposable or sacrificial spacer. In some embodiments, the first spacer is directly adjacent and abutting the gate stack.

Figures 5A, 5B, 5C:
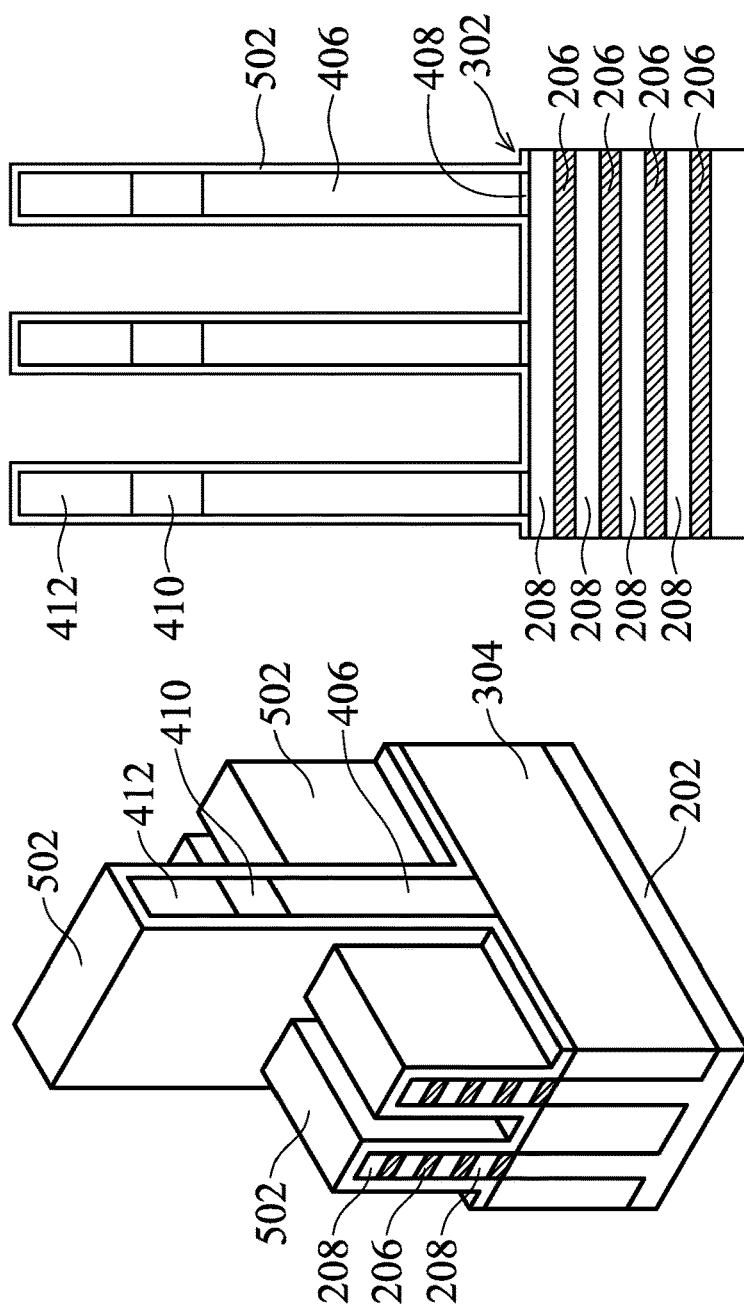

With reference to FIGS. 5A, 5B, 5C, in an embodiment of block 116, sidewall spacer material 502 may be deposited over the fins 302 and gate stack 402. The sidewall spacer material 502 may be amorphous silicon; some other examples include that the deposited spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers, such as main spacer walls, liner layers, and the like. By way of example, the spacer material layer may be formed by depositing a dielectric material over the gate stacks 402 processes such as, CVD process, a subatmospheric CVD (SACVD) process, a flowable CVD process, an ALD process, a PVD process, or other suitable process.

In some embodiments, the deposition of the spacer material layer is followed by an etching back (e.g., anisotropically) of the dielectric spacer material. Referring to the example of FIGS. 6A, 6B, and 6C, after formation of the sidewall spacer material layer 502, the sidewall spacer material layer 502 may be etched-back to expose portions of the fin elements 302 adjacent to and not covered by the gate stacks 402 (e.g., source/drain regions). See FIGS. 6A and 6C. The spacer layer material may remain on the sidewalls of the gate stacks 402 forming first sidewall spacers 602. In some embodiments, etching-back of the spacer material layer may include a wet etch process, a dry etch process, a multiple-step etch process, and/or a combination thereof. The spacer material layer may be removed from a top surface of the exposed epitaxial stack 204, and from the lateral surfaces of the exposed epitaxial stack 204, for example, in source/drain regions adjacent to the gate stacks 402. The spacer layer may also be removed from a top surface of the gate stacks 402, as illustrated in FIGS. 6B and 6A.

The method 100 then proceeds to block 118 where a second spacer material layer is deposited on the substrate. The second spacer material layer may be deposited as a conformal layer that is subsequently etched back to form spacer elements on sidewalls of the gate stacks. The spacer material layer is a suitable dielectric composition. Some examples include that the deposited spacer material layer may include a dielectric material such as silicon nitride, low-k dielectric materials, SiOCN, and/or combinations thereof. In some embodiments, the spacer material layer includes multiple layers, such as main spacer walls, liner layers, and the like. By way of example, the spacer material layer may be formed by depositing a dielectric material over the gate stacks 402 processes such as, CVD process, a subatmospheric CVD (SACVD) process, a flowable CVD process, an ALD process, a PVD process, or other suitable process. In an embodiment, the spacer material layer of block 118 is of a different composition than the spacer material layer of block 116. For example, the material of block 116 may include a composition such that it is selectively etched to the composition of block 118 (i.e., the second spacer is maintained during an etch removal of the first spacer).

With reference to FIGS. 7A, 7B, 7C, in an embodiment of block 118, second sidewall spacer material layer 702 is formed on the sidewalls of the gate stacks 402 and overlying the first sidewall spacer elements 602. In some embodiments, the deposition of the second spacer material layer is followed by an etching back (e.g., anisotropically) of the second spacer material layer. Referring to the example of FIGS. 8A, 8B, and 8C, after formation of the second spacer material layer 702, the second spacer material layer 702 may be etched-back. The etching-back may expose portions of the fin elements 302 adjacent to and not covered by the gate stacks 402 (e.g., source/drain regions). The second spacer material layer 702 may remain on the sidewalls of the gate stacks 402 forming sidewall spacers 802. In some embodiments, etching-back of the second spacer material layer may include a wet etch process, a dry etch process, a multiple-step etch process, and/or a combination thereof. The second spacer material layer may be removed from a top surface of the exposed epitaxial stack 204, and from the lateral or top surfaces of the exposed epitaxial stack 204, for example, in source/drain regions adjacent to the gate stacks 402. The second sidewall spacer material layer 702 may also be removed from a top surface of the gate stacks 402, as illustrated in FIGS. 8A, 8B, and 8C.

The method 100 then proceeds to block 120 where source/drain features are formed. Initially, in an embodiment of block 120, after formation of the gate stacks 402, the first sidewall spacer elements 602, the stack 204 is exposed in the source/drain region. After exposing the stack 204, a trench (or opening) is etched in the stack. In some embodiments, etching-back of the second spacer material layer 702 may be concurrent with the formation of the trench. Etching the stack 204 to form the trench may include a wet etch process, a dry etch process, a multiple-step etch process, and/or a combination thereof. In some embodiments, a photolithography process is used to define the area of etching (e.g., source/drain region). Referring to the example of FIGS. 8A, 8B, 8C, trenches 804 are formed in the source/drain region by the etching processes of block 120. As illustrated in FIGS. 8A, 8B, 8C, the trench 804 has at least one sidewall that is defined by the stack 204 (e.g., epitaxial layers 206 and 208). This sidewall may be advantageous as the growth of epitaxial material, as discussed below, can be performed to a higher quality with an interface to a semiconductor material as opposed to a dielectric material such as found in a dielectric material inner spacer.

Figure 9A:
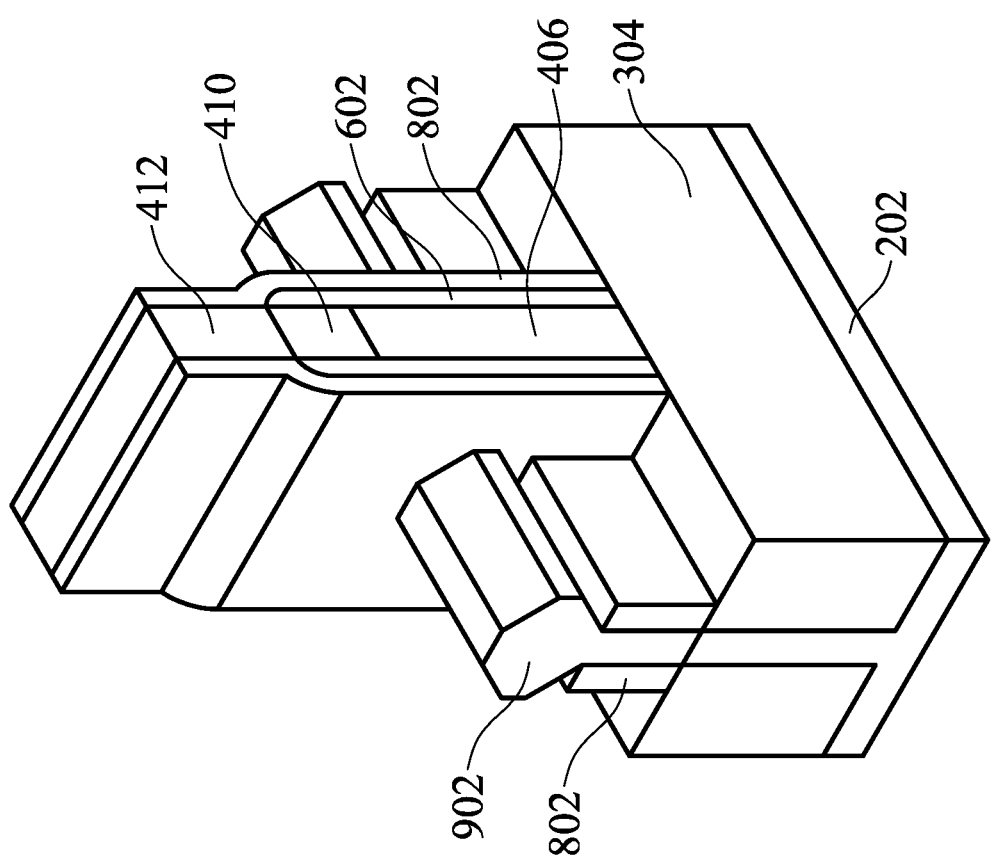

Referring to the example of FIGS. 9A, 9B, and 9C, in a further embodiment of block 120, source/drain features 902 are formed in source/drain regions adjacent to and on either side of the gate stacks 402 in within the trenches 804. In some embodiments, the source/drain features 902 are formed by epitaxially growing a semiconductor material layer or layers on the exposed semiconductor material of the fin element 302 over the substrate 202 in the source/drain regions.

In various embodiments, the semiconductor material layer grown to form the source/drain features 902 may include Ge, Si, GaAs, AlGaAs, SiGe, GaAsP, SiP, or other suitable material. The source/drain features 902 may be formed by one or more epitaxial (epi) processes. In some embodiments, the source/drain features 902 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 902 are not in-situ doped, and instead an implantation process is performed to dope the source/drain features 902. In some embodiments, formation of different source/drain features 902 on the substrate 202 may be performed in separate processing sequences for each of N-type and P-type source/drain features.

In an embodiment, the device 200 is a PFET and a suitable source/drain for a PFET is provided as source/drain feature 902. In an embodiment, the source/drain feature 902, such as illustrated in FIGS. 9B and 9C, has as first layer 902A and a second layer 902B, as illustrated. In an embodiment, the first layer 902A is epitaxially grown silicon. The first layer 902A may be doped with a p-type dopant such as boron. Thus, in an example, layer 902A is Si:B. In an embodiment, the second layer 902B is epitaxially grown silicon germanium (SiGe). The second layer 902B may also be suitably doped with a p-type dopant such as boron. Thus, in an example, layer 902B is SiGe:B. Thus, in an embodiment, the device 200 is a PFET and the source/drain 902 includes a layer 902A (Si) and a layer 902B (SiGe). In an embodiment, the first layer 902A has a thickness of between approximately 1 nm and approximately 5 nm. It is noted that in some embodiments the first layer 902A acts as an etch protection layer during the etching for example of portions of the epitaxial layer 206 (e.g., silicon germanium). Thus, the thickness may be selected such that sufficient protection is provided, while maintaining the source/drain performance. The layers 902A and 902B may be formed in-situ during an epitaxial growth process.

Figure 9D:
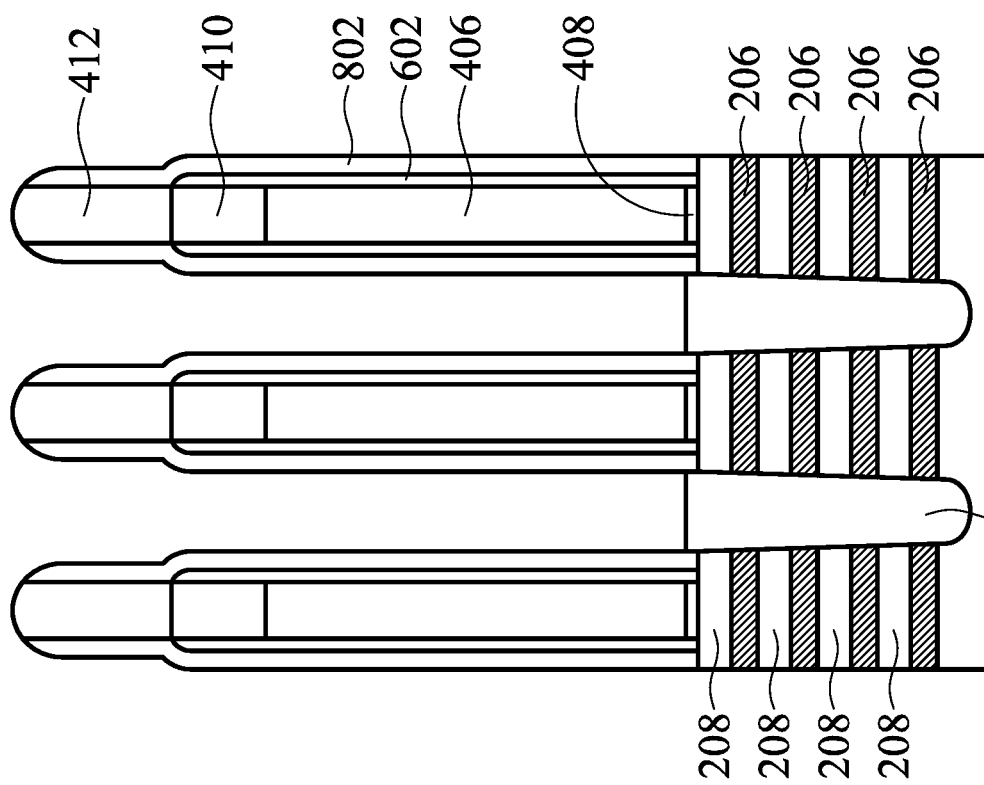
Figure 9E:
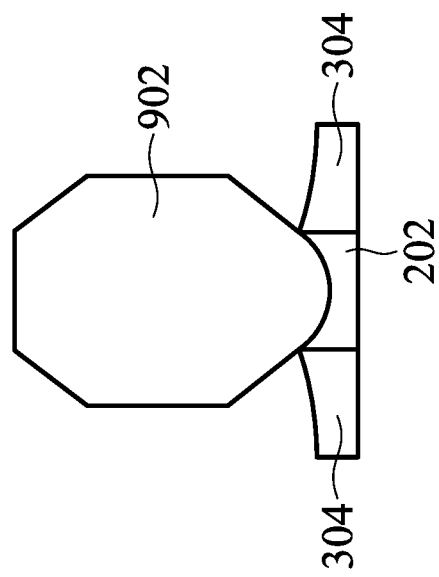
Figure 11A:
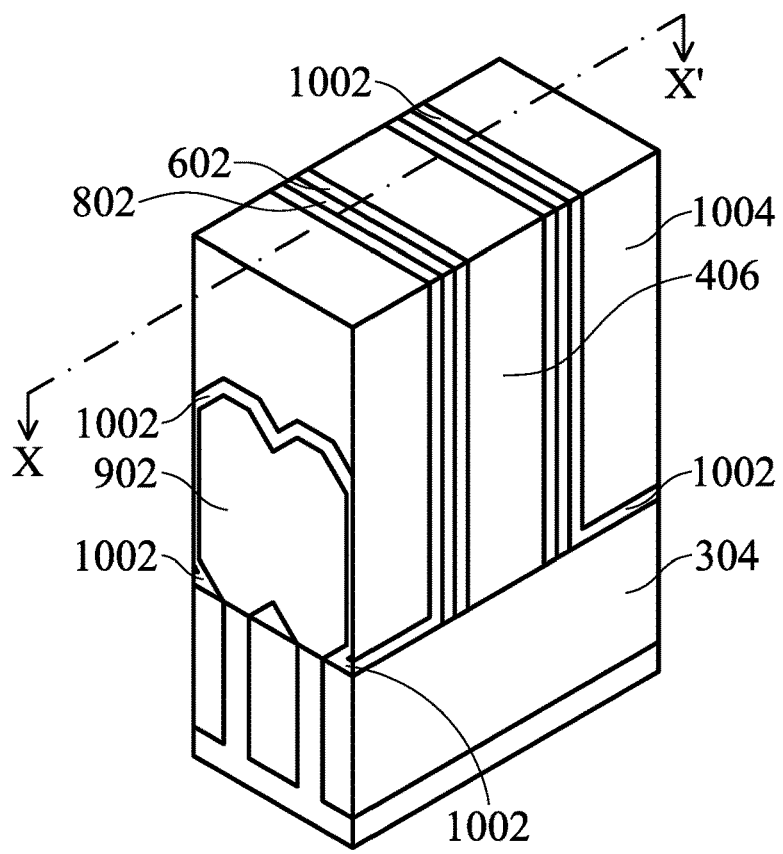
Figure 11B:
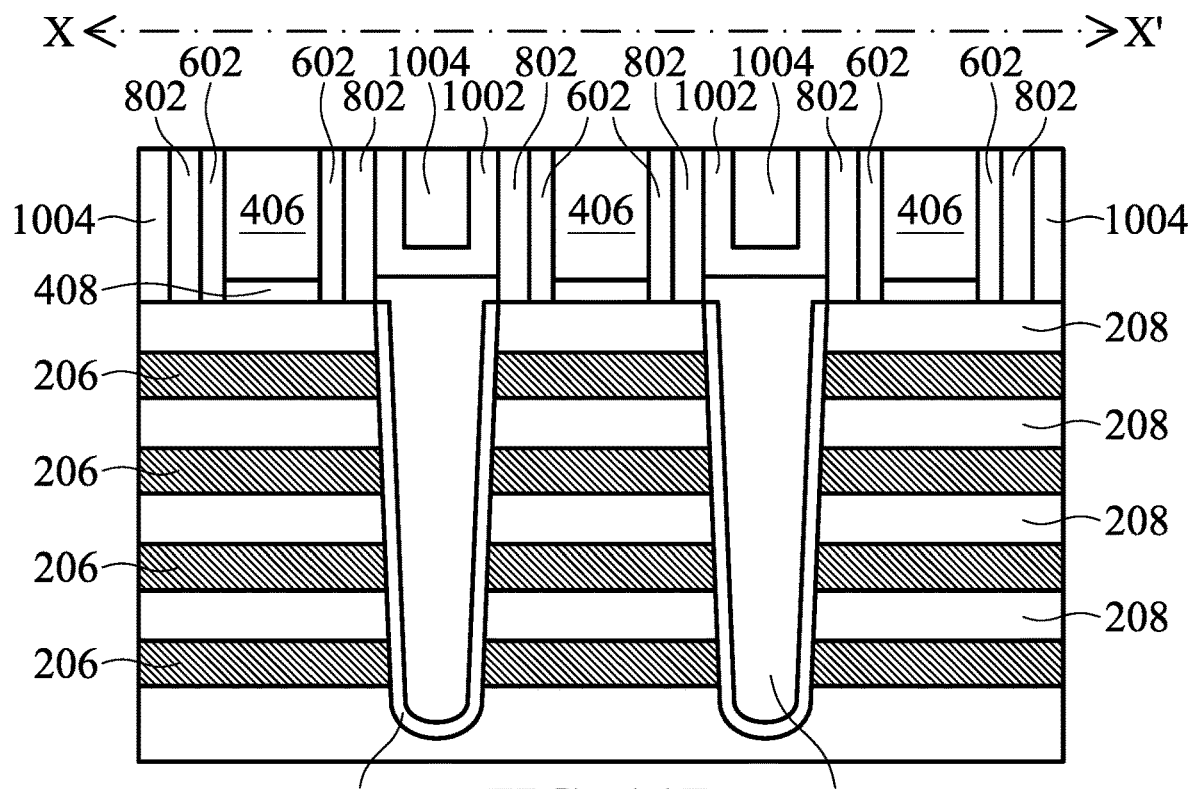
Figure 11C:
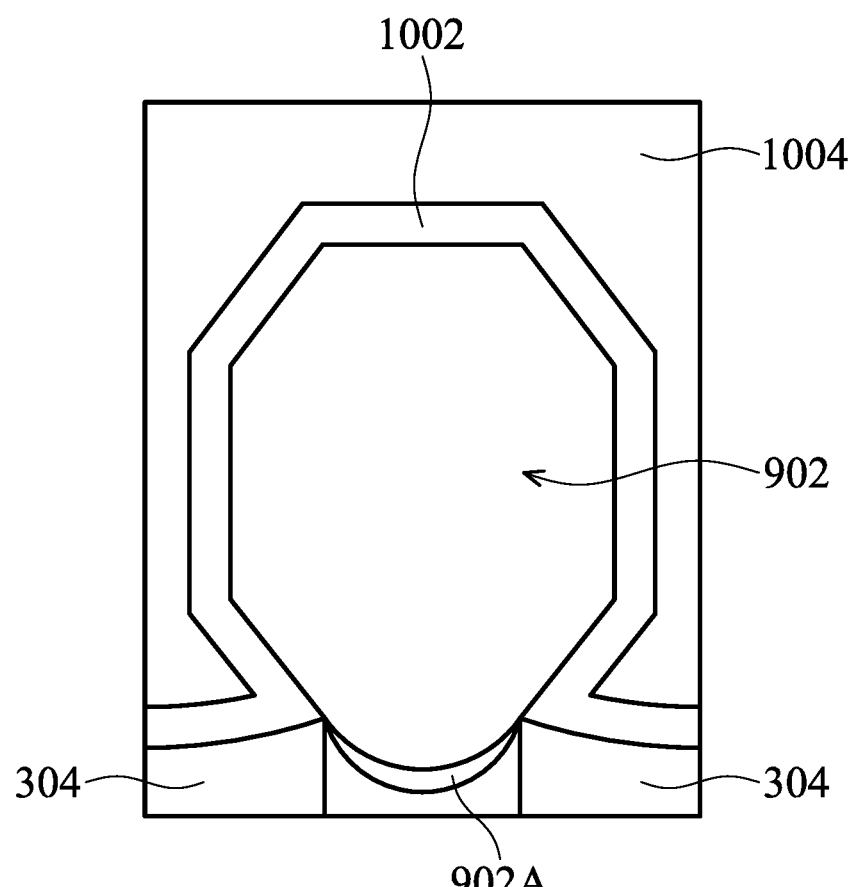
Figure 12A:
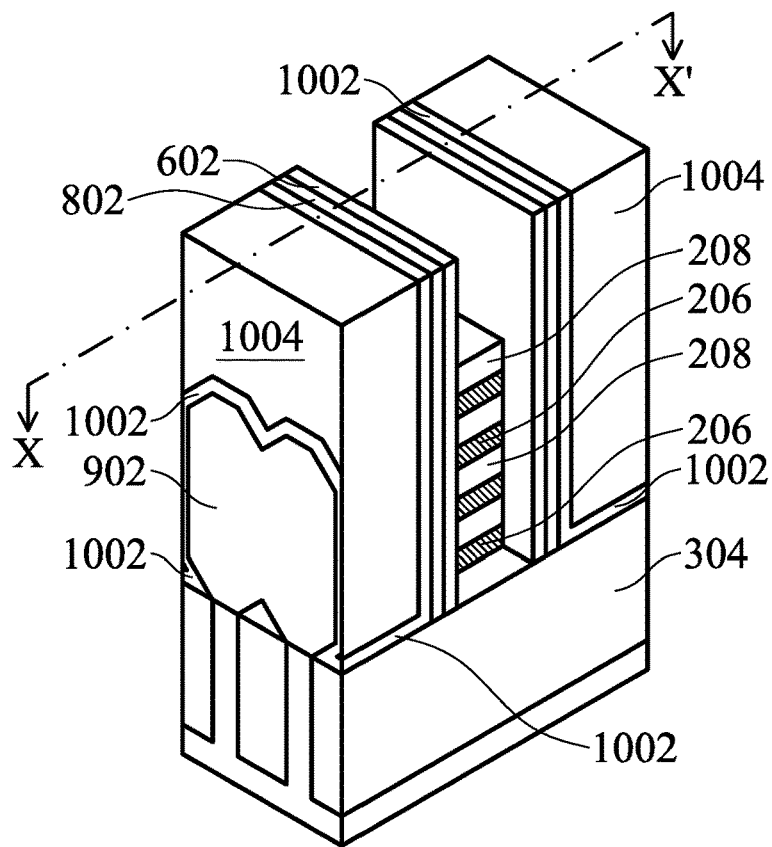
Figure 12B:
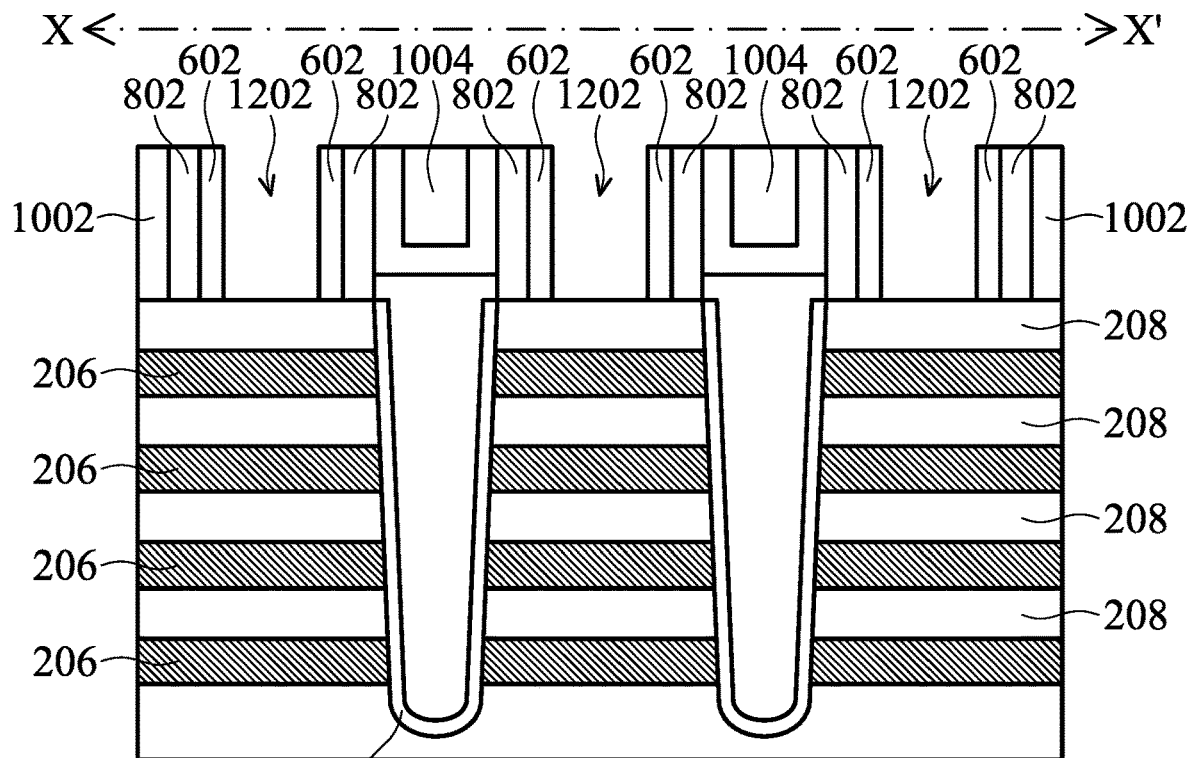
Figure 13A:
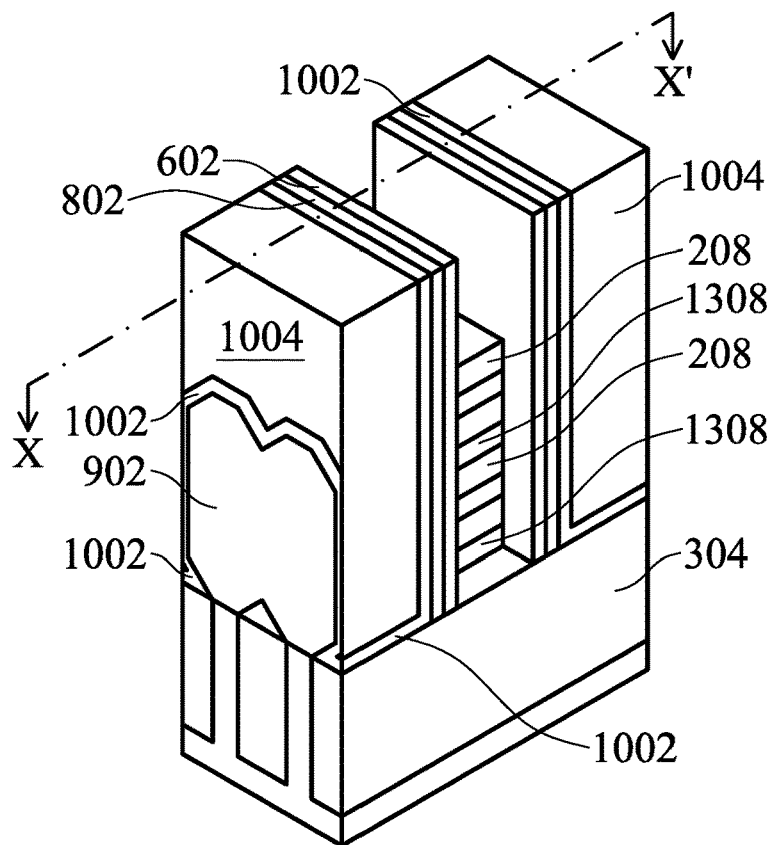
Figure 13B:
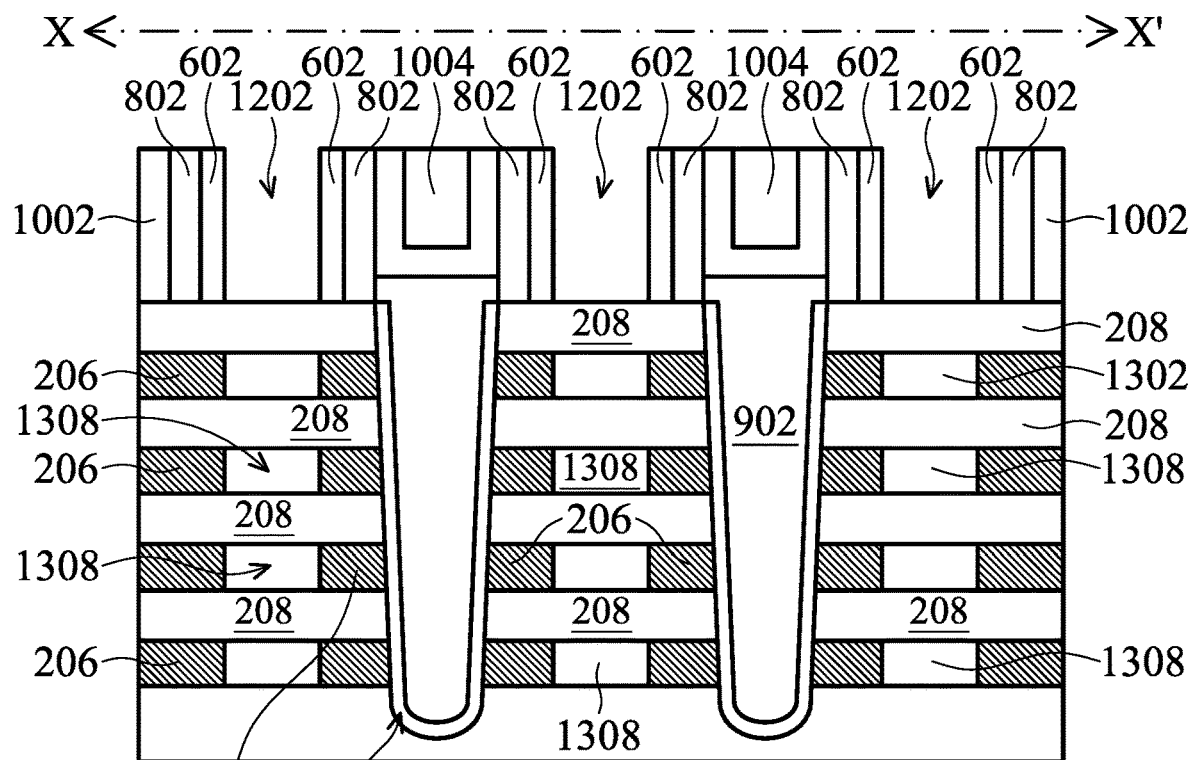

In an embodiment, the device 200 may be an NFET and the source/drain layer 902 may include epitaxially grown silicon (Si) that is suitably doped (e.g., with an n-type dopant such as phosphorous). In an embodiment, the source/drain layer 902 is a single layer such as illustrated in FIGS. 9D and 9E. In an embodiment, the device 200 is an NFET and the source/drain 902 is a single layer of Si:P. The NFET device 200 and the PFET device 200 may be similarly formed on the substrate 202. For example, the exemplary embodiment of FIGS. 9B and 9C may be formed on a same substrate as the exemplary embodiment of FIGS. 9D and 9E. It is noted that some of the illustrations in the following steps show a two layer epitaxial layer (e.g., 902A and 902B), however in other embodiments, a single epitaxial layer may be used for element 902.

The method 100 then proceeds to block 122 where one or more dielectric layers may be formed such as a contact etch stop layer (CESL) and/or an inter-layer dielectric (ILD) layer. Referring to the example of FIGS. 10A and 10B, as well as FIGS. 11A, 11B, and 11C, in an embodiment of block 122, an ILD layer 1004 is formed over the substrate 202. In some embodiments, a contact etch stop layer (CESL) 1002 is formed over the substrate 202 prior to forming the ILD layer 1004. In some examples, the CESL 1002 includes a silicon nitride layer, silicon oxide layer, a silicon oxynitride layer, and/or other materials known in the art. The CESL 1002 may be formed by plasma-enhanced chemical vapor deposition (PECVD) process and/or other suitable deposition or oxidation processes. In some embodiments, the ILD layer 1004 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1004 may be deposited by a PECVD process or other suitable deposition technique.

In some examples, after depositing the ILD 1004 (and/or CESL 1002 or other dielectric layers), a planarization process may be performed to expose a top surface of the gate stacks 402. For example, a planarization process includes a CMP process which removes portions of the ILD layer 1004 (and CESL 1002 layer, if present) overlying the gate stacks 402 and planarizes a top surface of the semiconductor device 200. In addition, the CMP process may remove the hard mask layers 410 and 412 overlying the gate stacks 402 to expose the underlying electrode layer 406, such as a polysilicon electrode layer, of the dummy gate.

The method 100 proceeds to block 124 where the dummy gate discussed above in block 114 is removed. In some examples, the etching process that removes the dummy gate may include a wet etch, a dry etch, or a combination thereof. Referring to the example of FIGS. 12A and 12B, the gate stacks 402 have been removed leaving trench openings 1202. The trench openings 1202 may have a sidewall defined by the first spacer element 602 and expose the channel region of the stack 204.

Having the channel region now exposed, thereafter, in some examples and in an embodiment of block 124, a selective removal of the epitaxial layer(s) in the channel region of the GAA device is provided. In embodiments, the selected epitaxial layer(s) are removed in the fin elements within the trench opening provided by the removal of the dummy gate electrode (e.g., the region of the fin on and over which the gate structure will be formed, or the channel region). Referring to the example of FIGS. 13A and 13B, portions of the epitaxy layers 206 are removed, in particular are removed from the channel region of the substrate 202 and within the trench opening 1202. In some embodiments, the epitaxial layers 206 are removed by a selective wet etching process. In some embodiments, the selective wet etching includes ammonia and/or ozone. As merely one example, the selective wet etching includes tetra-methyl ammonium hydroxide. (TMAH). In an embodiment, the epitaxial layers 206 are SiGe and the epitaxial layers 208 are silicon, allowing for the selective removal of the SiGe epitaxial layers 206. It is noted that during the interim processing stage of block 124 (e.g., FIGS. 13A and 13B), gaps 1308 are provided between the adjacent nanowires in the channel region (e.g., gaps 1308 between epitaxy layers 208). The gaps 1308 may be filled with the ambient environment conditions (e.g., air, nitrogen, etc.). In addition, the gaps 1308 extend to abut portions of the layers 206 underlying the first sidewall spacer element 602. It is noted that the lateral etching of the layers 206 to form the gaps 1308 may be controlled by time-based etching, for example, such that the gaps 1308 extend substantially in-line with the first spacer element 602.

The method 100 then proceeds to block 126 where a gate structure is formed. The gate structure formed may be a high-K/metal gate stack, however other compositions are possible. In some embodiments, the gate structure may form the gate associated with the multi-channels provided by the plurality of nanowires (epitaxial layers 208, now having gaps 1308 there between) in the channel region of the device (device 200).

Figure 14A:
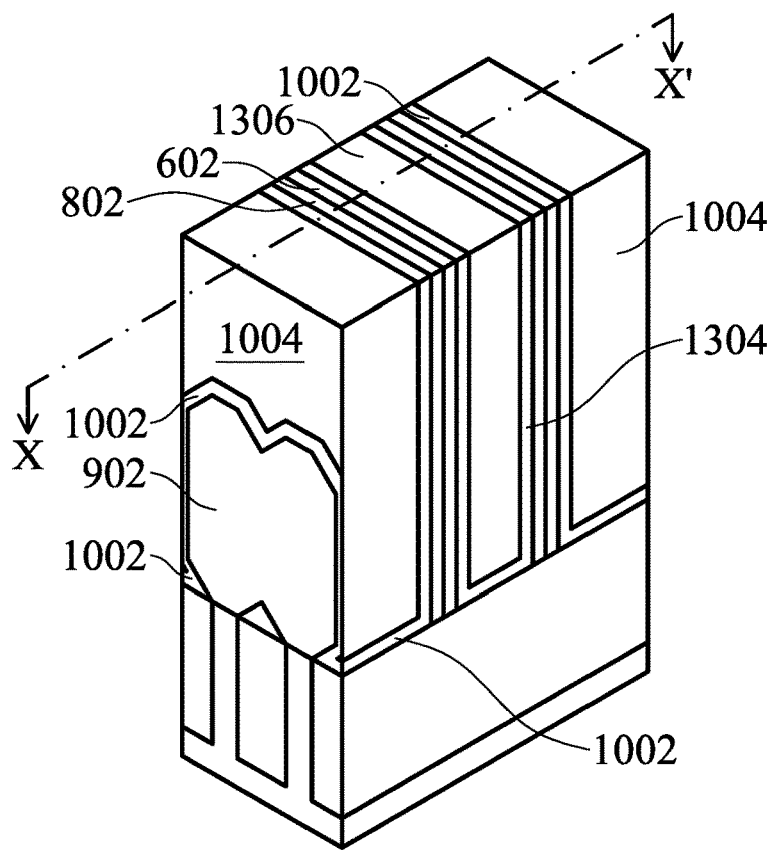
Figure 14B:
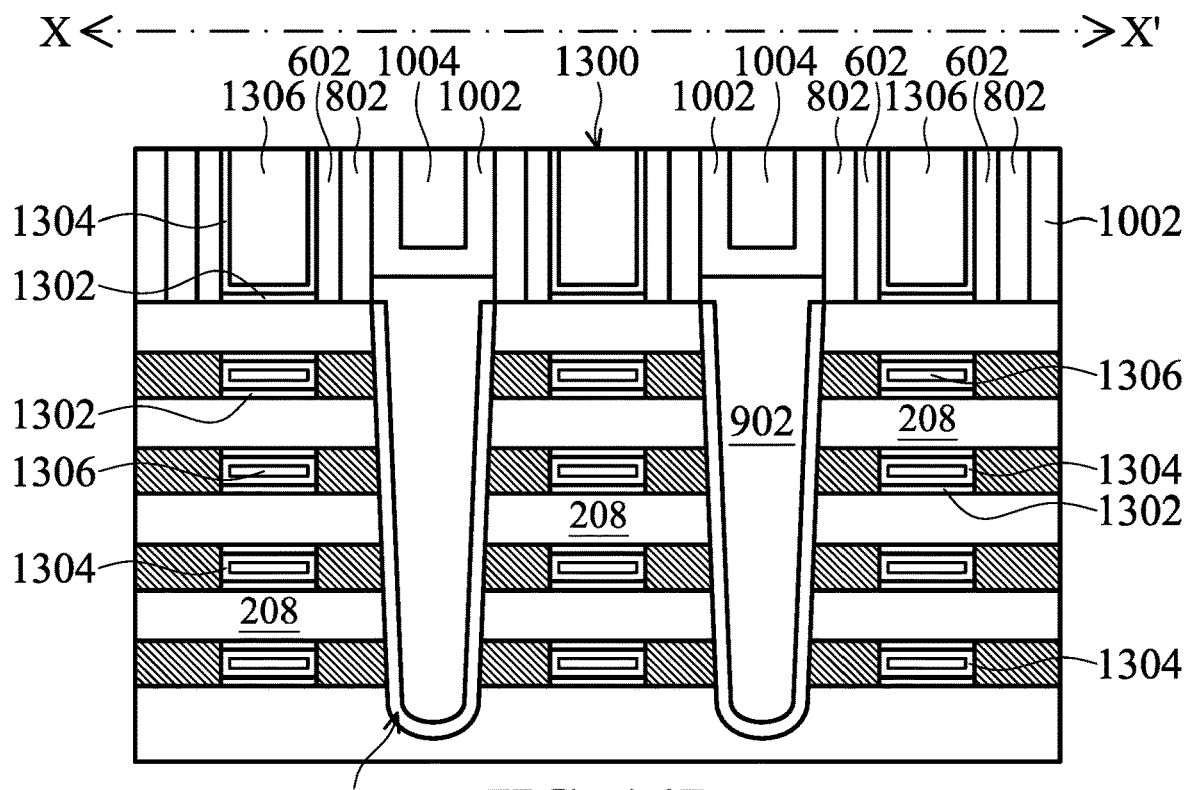

Referring to the example of FIGS. 14A and 14B, in an embodiment of block 126, a gate dielectric is formed within the trench of the GAA device in the openings provided by the removal of the dummy gate and/or release of nanowires, described above with reference to block 124. In various embodiments, the gate dielectric includes an interfacial layer (IL) 1302 and a high-K gate dielectric layer 1304 formed over the interfacial layer. High-K gate dielectrics, as used and described herein, include dielectric materials having a high dielectric constant, for example, greater than that of thermal silicon oxide (~3.9).

In some embodiments, the interfacial layer 1302 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer 1304 may include a high-K dielectric layer such as hafnium oxide ($HfO_2$). Alternatively, the high-K gate dielectric layer 1304 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1304 may be formed by ALD, physical vapor deposition (PVD), CVD, oxidation, and/or other suitable methods.

In a further embodiment of block 126, a metal gate electrode including a metal layer 1306 is formed over the gate dielectric 1304 of the GAA device. The metal layer 1306 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the semiconductor device 200.

In some embodiments, the metal layer 1306 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1306 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1306 may be formed by ALD, PVD, CVD, e-beam evaporation, or other suitable process. Further, the metal layer 1306 may be formed separately for N-FET and P-FET transistors which may use different metal layers. In various embodiments, a CMP process may be performed to remove excessive metal from the metal layer 1306 for example deposited over the ILD layer 1004, and thereby provide a substantially planar top surface of the metal layer 1306. In addition, the metal layer 1306 may provide an N-type or P-type work function, may serve as a transistor (e.g., GAA) gate electrode, and in at least some embodiments, the metal layer 1306 may include a polysilicon layer. The gate structure includes portions that interpose each of the epitaxial layers 208, which each form channels of the GAA device. The gate structure including the IL 1302, the gate dielectric layer 1304 and the metal layer(s) 1306 may collectively be referred to as the gate structure 1300.

The method 100 then proceeds to block 128 where the first spacer elements are removed adjacent the gate structure (see above in block 126). The first spacer elements are removed to form a gap region, which may be filled with ambient environment conditions (e.g., air, nitrogen, etc.). The spacer elements may be removed by suitable etching processes such as a wet etch or dry etching process. In some embodiments, the etching process used to remove the first spacer elements is selective to material of the first spacer element leaving the second spacer material and underlying semiconductor material without substantial etching.

Figure 15A:
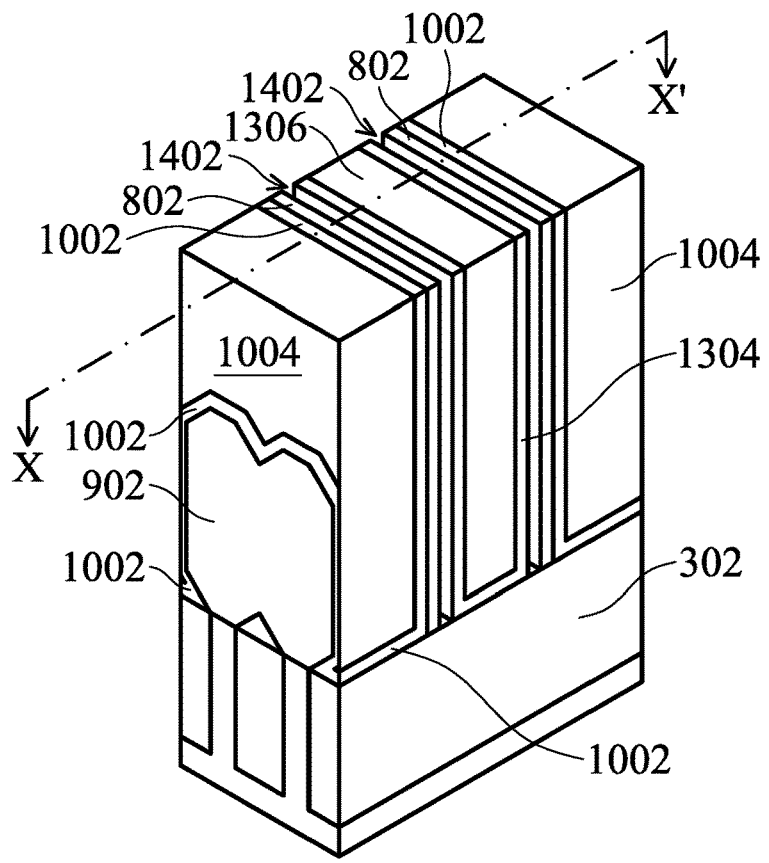
Figure 15B:
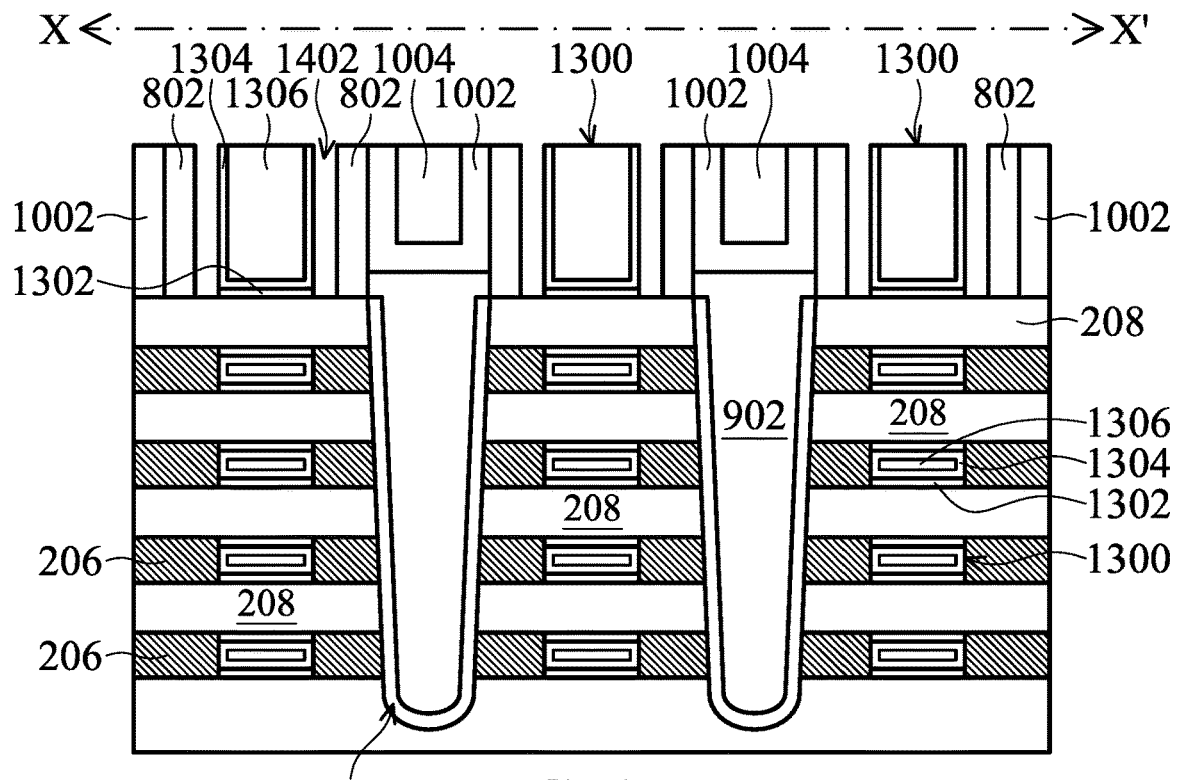

Referring to the example of FIGS. 15A and 15B, the first spacer elements 602 have been removed creating openings 1402. As illustrated, the openings 1402 may include a sidewall defined by the second spacer 802 and the gate stack 1300 (e.g., the gate dielectric 1304 and IL 1302).

The method 100 then proceeds to block 130 where inner spacers are formed adjacent the channel regions of the GAA and between the channel and the source/drain feature. The inner spacers may be formed as an air gap, or generally gap regions, which may be filled with ambient environment conditions (e.g., air, nitrogen, etc.). The gap regions may be formed by removal of portions of the nanowire/nanosheet adjacent the gate stack. The removal may be performed by suitable wet etching or dry etching processes. The removal of the semiconductor material adjacent the gate stacks can be done in effect through the opening provided by the removal of the first spacer elements, discussed above in block 128.

Figure 16A:
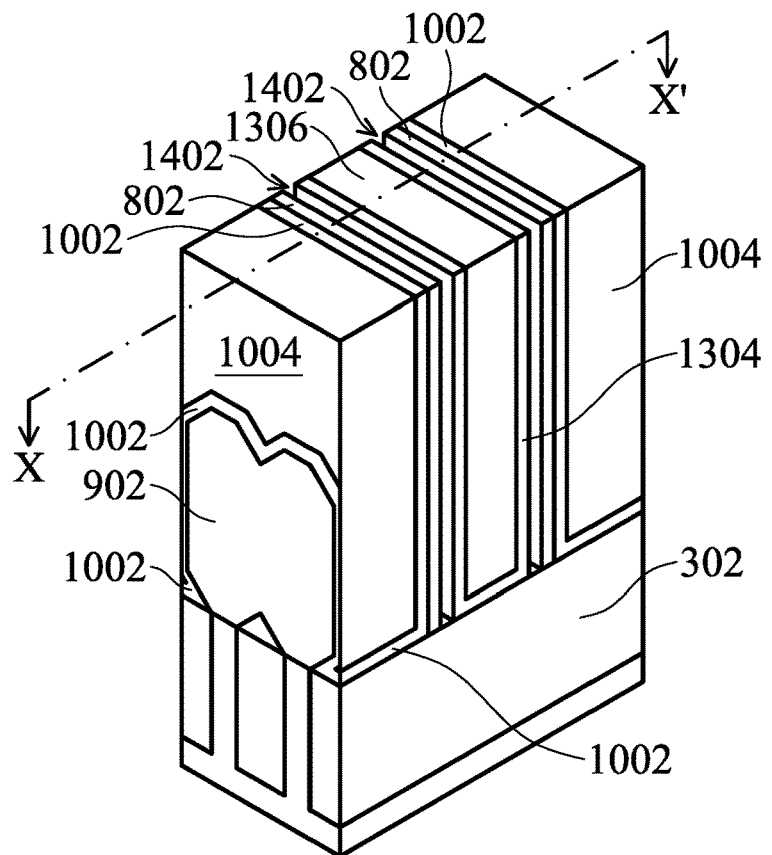
Figure 16B:
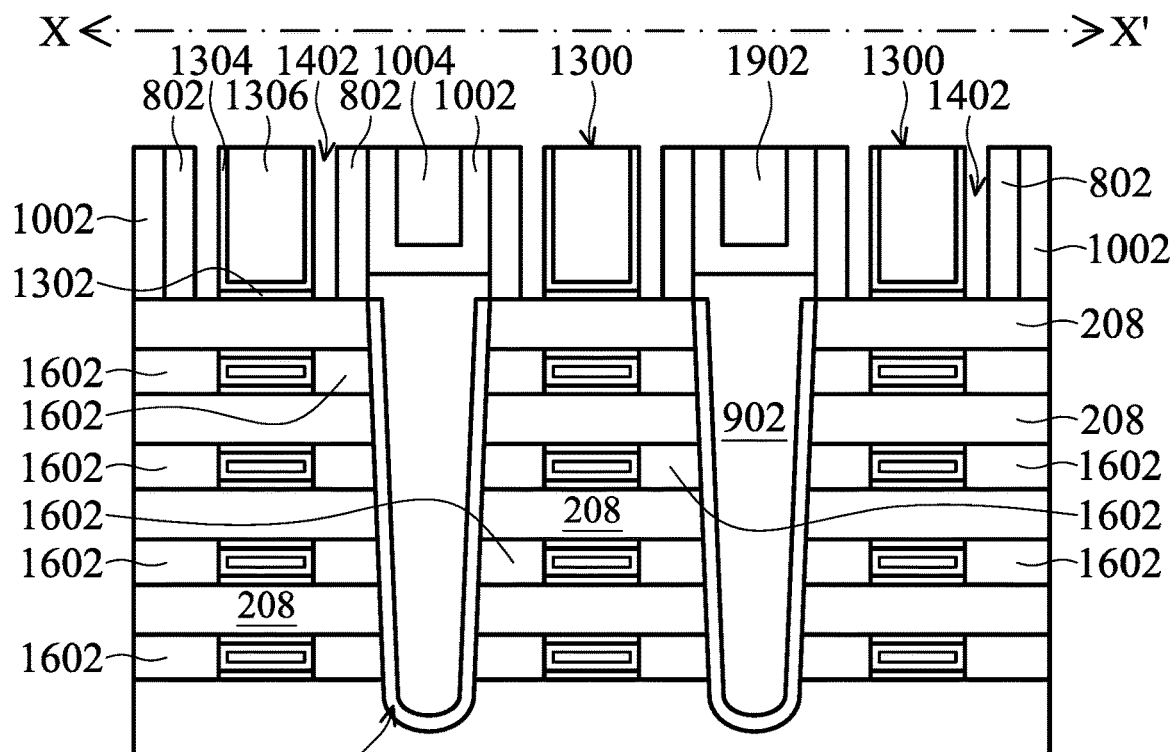

Referring to the example of the embodiment of FIGS. 16A and 16B, the air gaps 1602 are formed by selective removal of portions of the epitaxial layer 206. In an embodiment, the air gaps 1602 are removed by applying an etchant selective to silicon germanium composition of epitaxial layer 206.

In some embodiments, for example, the device 200 includes a PFET device that has an epitaxial source/drain of a first layer 902A and a second layer 902B. In some embodiments, the second layer 902B is silicon germanium (e.g., doped with a p-type dopant). The first layer 902A acts as an etch stop layer during the removal of epitaxial layer 206, the first layer 902A being a different composition—such as doped silicon. In other embodiments, the epitaxial source/drain 902 is a single composition, such as doped silicon, and the etchant provided to remove the epitaxial layer 206 does not significantly etch the epitaxial source/drain 902 (obliviating the need for a liner such as 902A).

The air gaps 1602 may be filled with air, which provides a dielectric constant of approximately 1. The air gaps 1602 have a sidewall interfacing the gate stack 1300 and an opposing sidewall interfacing the source/drain 902. Thus, the dielectric nature of this air gap 1602 allows for a lower parasitic capacitance between the gate stack 1300 and the source/drain 902. The air gaps further have a top and bottom surface interfacing the epitaxial layer 208, which forms the channel of the device 200.

The method 100 then proceeds to block 132 where material for a seal layer is deposited. The material for a seal layer may be a silicon based dielectric layer. Exemplary compositions include, but are not limited to, SiOC, SiO2, SiN, SiOCN, SiON, and/or other suitable dielectric compositions. The material of the seal layer may be then etched-back to have a top surface coplanar with a top surface of the gate stacks. In an embodiment, a CMP process is performed to provide the planar top surface.

Figure 17A:
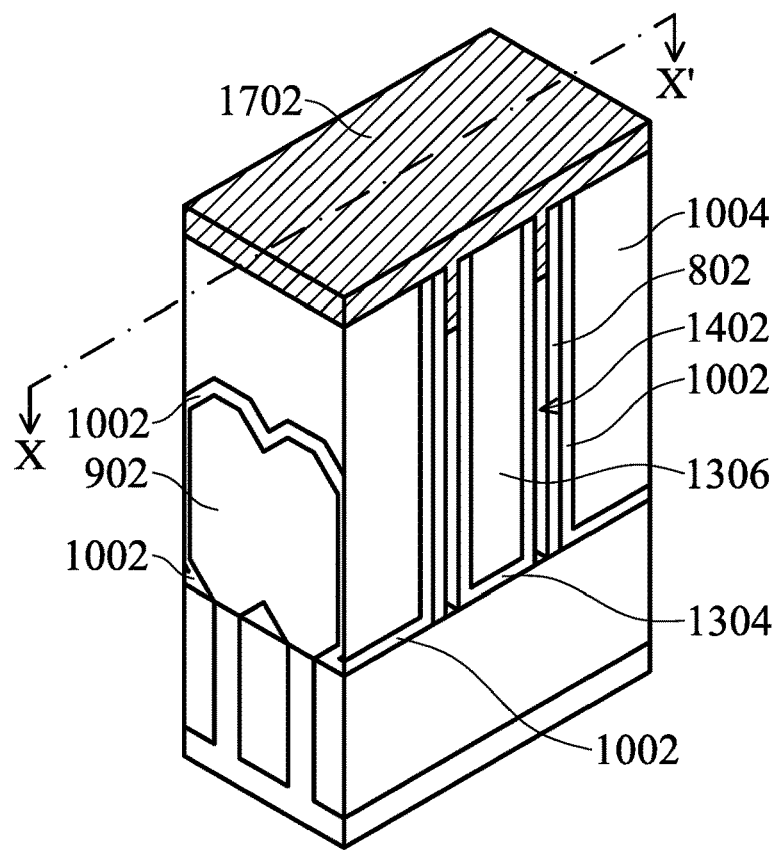
Figure 17B:
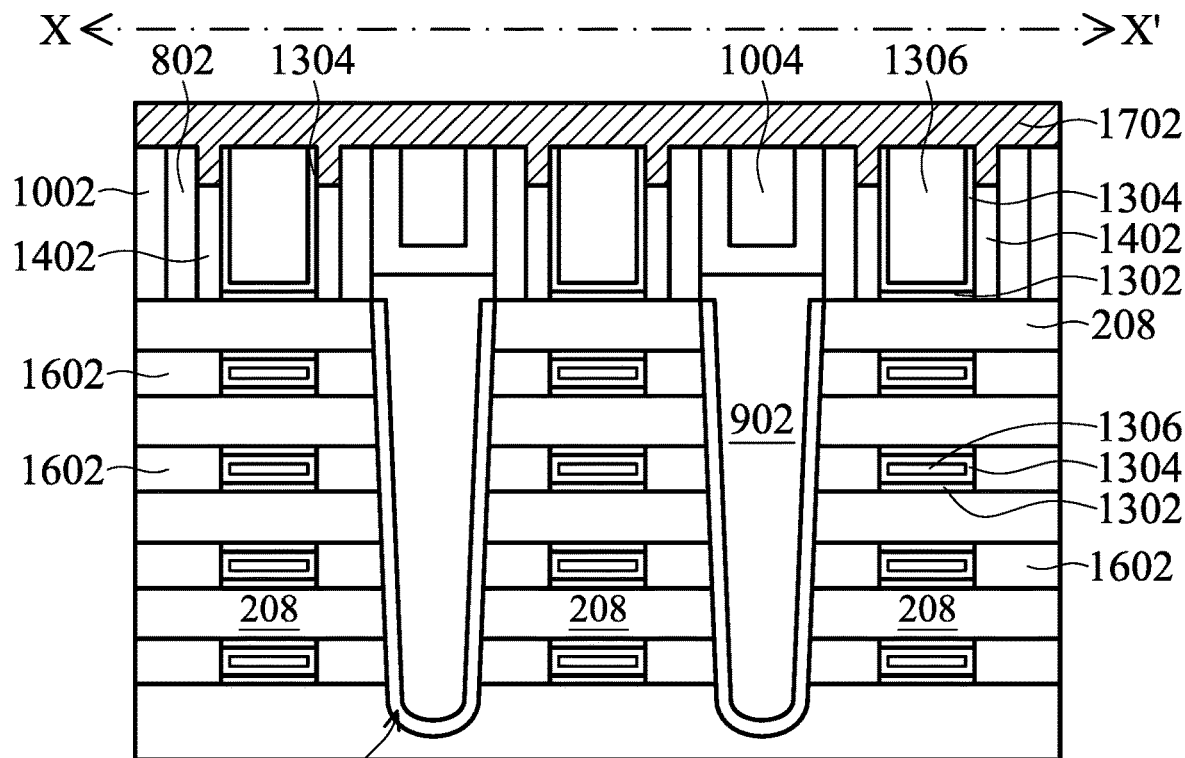
Figure 18A:
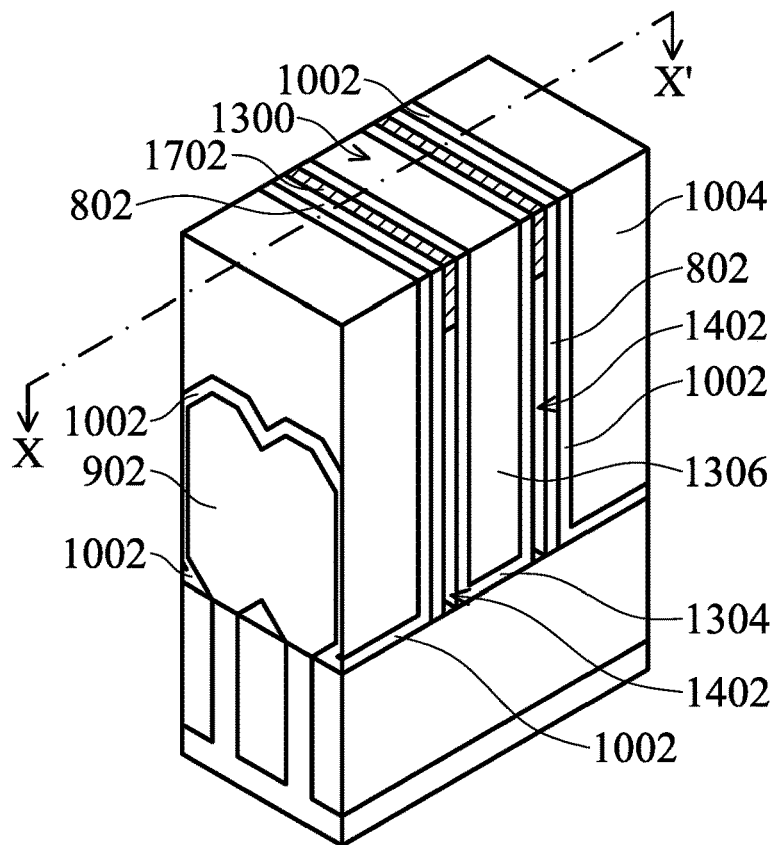
Figure 18B:
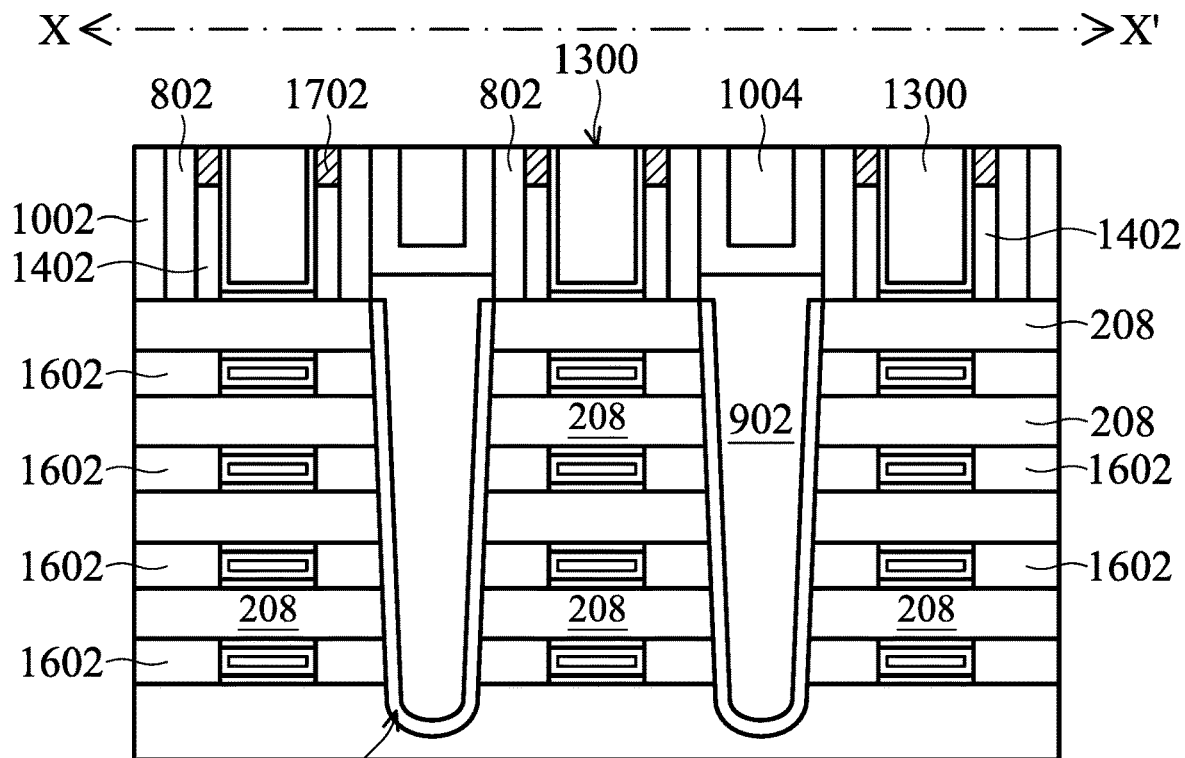
Figure 19A:
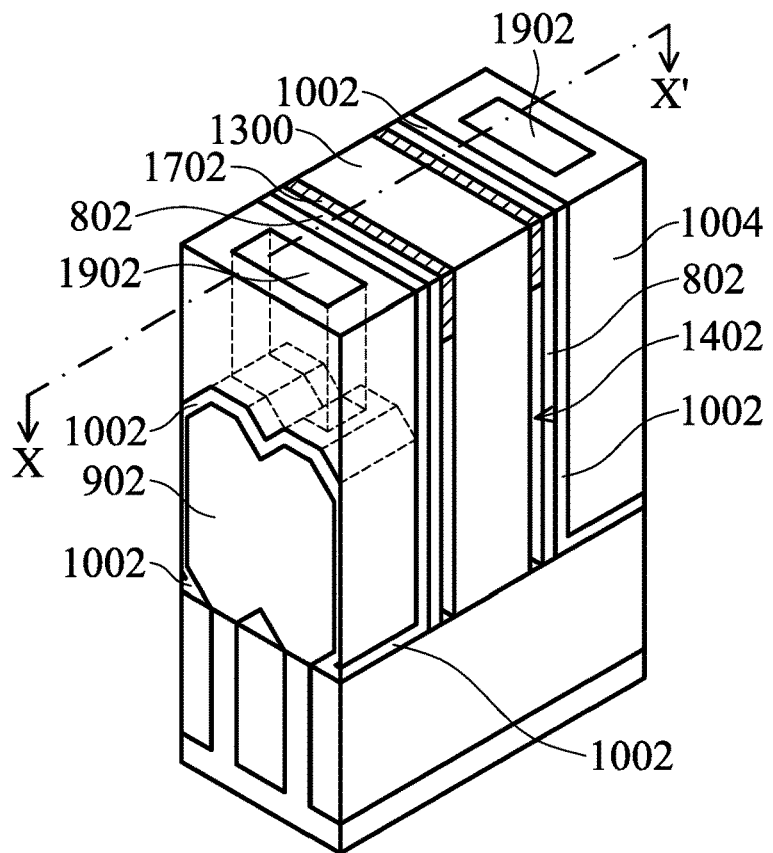
Figure 19B:
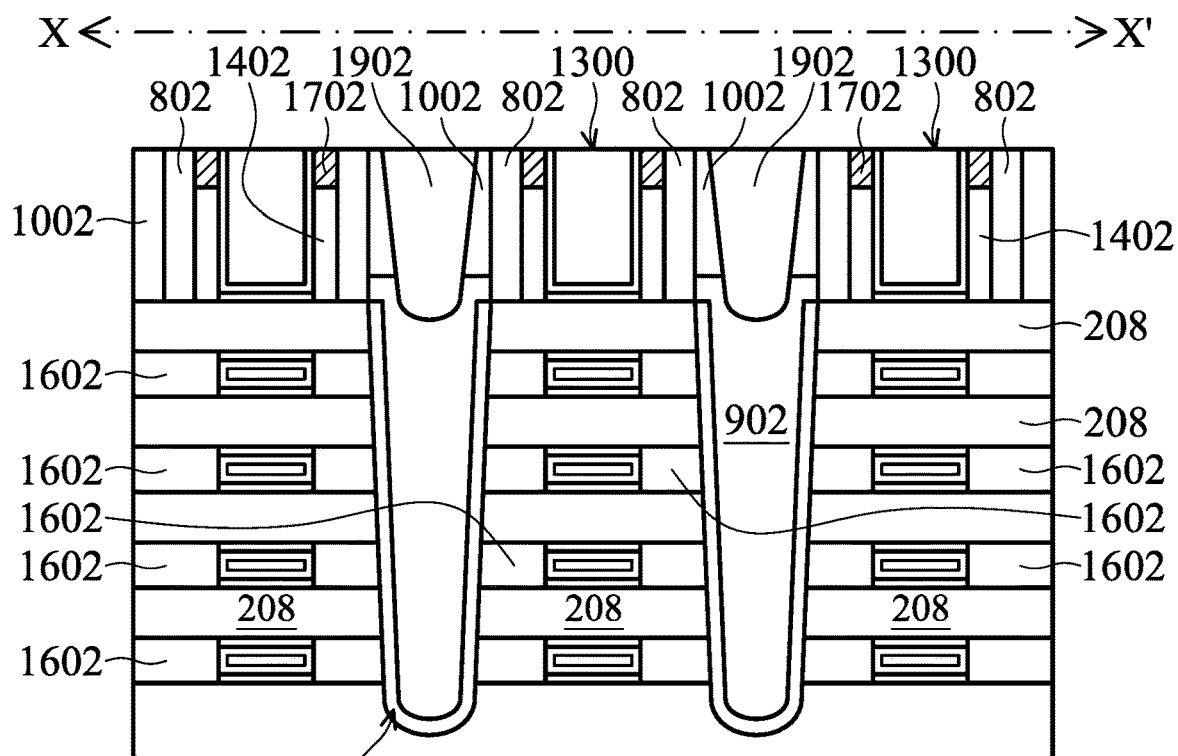

Referring to the example of FIGS. 17A and 17B, material 1702 for a seal layer is deposited on the substrate 202. The material 1702 extends into the openings 1402 adjacent the gate structure 1300. FIGS. 18A and 18B illustrates the device after planarization of the material forming seal layer 1702. The seal layer 1702 acts to cap the openings 1402. In an embodiment, the seal layer 1702 is between approximately 2 nm and 30 nm in height. In an embodiment, the seal layer 1702 is between approximately 1 and 8 nanometers in width. The provision of seal layer 1702 provides air gap 1402 adjacent the main gate stack 1300 (e.g., the gate stack above the epitaxial stack 204).

The semiconductor device 200 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100. Referring to the example of FIGS. 19A and 19B, contacts 1902 are formed to the source/drain regions 902. In some embodiments, the contacts 1902 remove the ILD 1004 such that the CESL 1002 is exposed. In other embodiment, the contacts 1902 are formed in the ILD 1004 such that a portion of the ILD 1004 remains between the contact 1902 and the CESL 1002.

Figure 20A:
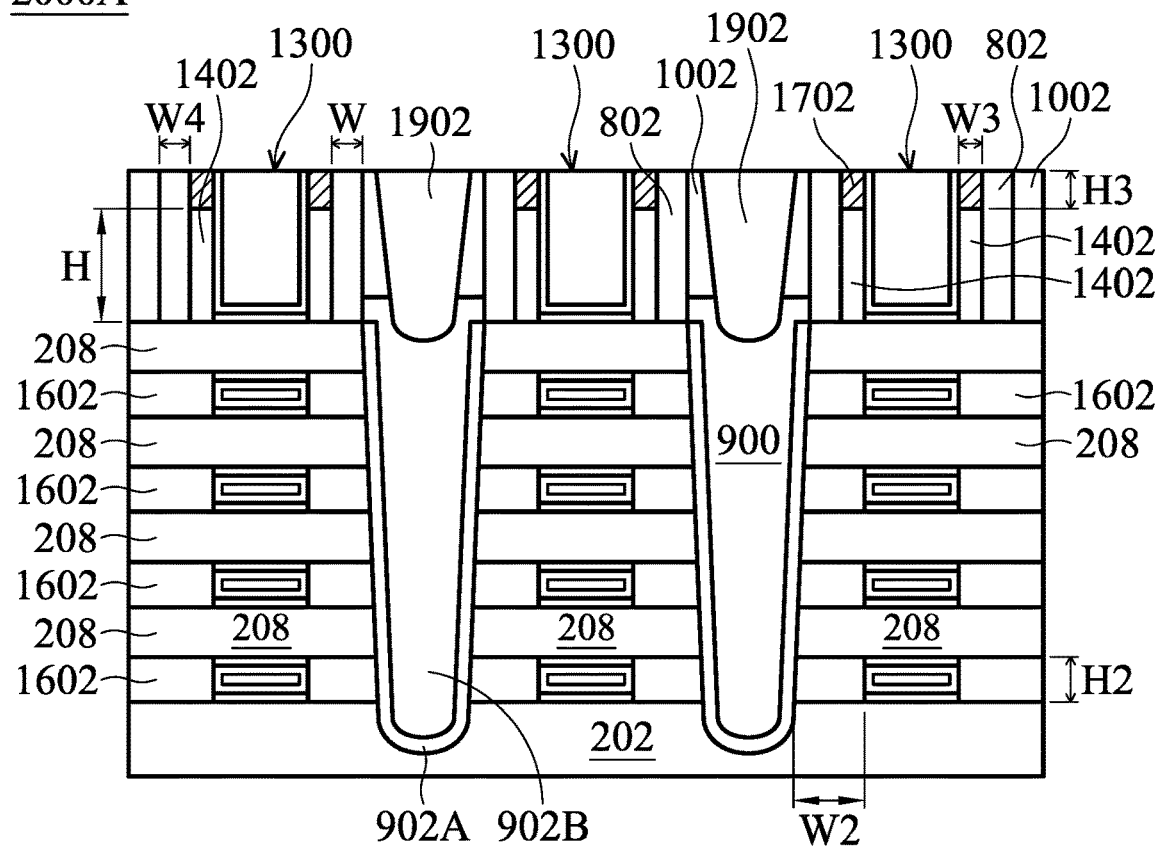
FIGS. 20A and 20B are a cross-sectional embodiment of a device 2000A and 2000B according to aspects of the present disclosure.
Figure 20B:
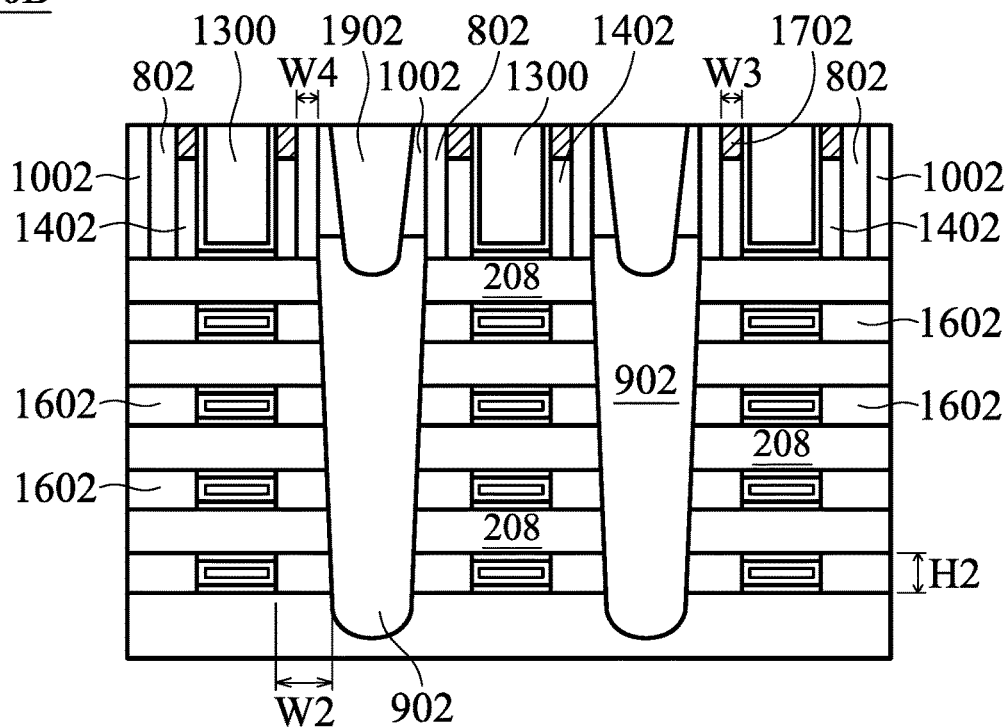

Referring now to FIG. 20, illustrated is a cross-sectional view of a device 2000A and a device 2000B. The devices 2000A and 2000B may be formed substantially using embodiments of the method 100 of FIG. 1 and may be substantially similar to the device 200 described above. In particular, similar components in the devices 2000A and 2000B as discussed above with reference to the device 200 are noted by using similar reference numbers. The devices 2000A and 2000B may be formed on a single substrate 202 and interconnected to form an integrated circuit. In an embodiment, the device 2000A provides a PFET and the device 2000B provides an NFET.

In an embodiment, the height H of the air gap 1402 may be between approximately 2 and approximately 30 nm. In an embodiment, the width W of the air gap 1402 may be between approximately 1 and approximately 8 nm. The gap 1402 may include air. The width of the air gap 1402 may be sufficient perform the removal of epitaxial layer 208 to form the air gaps 1602. The height H may be such that sufficient thickness of seal 1702 is provided to maintain the air gap 1402 without collapse.

In an embodiment, the gap 1602 (inner spacer) may also include air. The gap 1602 may have a width W2 of between approximately 2 nm and approximately 10 nm. In an embodiment, the gap 1602 has a height H2 of between approximately 2 nm and approximately 10 nm. The dimensions of the gap 1602 are controlled based on the sizing of the channel.

In an embodiment, the seal 1702 may also include a dielectric material such as SiOC, SiO2, SiN, SiOCN, SiON. The seal 1702 may have a width W3 of between approximately 1 nm and approximately 8 nm. In an embodiment, the seal 1702 has a height H3 of between approximately 2 nm and approximately 30 nm.

In an embodiment, the spacer 802 may also include a dielectric material such as SiN, SiOCN, or low k materials such as doped silicon oxides. The spacer 802 may have a width W4 of between approximately 2 nm and approximately 8 nm. The thickness of the spacer 802 may be determined based on the desired displacement of the source/drain features from the channel region. For example, a smaller W4 may lead to short channel effects as the source/drain is too close to the channel. A larger W4 may lead to high resistance for the device as the source/drain is too far from the channel.

In an embodiment, the CESL 1002 may also include a dielectric material such as SiN, SiCON, and the like. The CESL 1002 may have a width W5 of between approximately 2 nm and approximately 8 nm. The width W5 may be determined by the distance between the second spacer 802 and the dielectric layer (ILD) 1004.

With respect to the description provided herein, the present disclosure offers methods and structures for improving device performance and fabrication processes for GAA devices by forming air gap structures adjacent the gate stacks. Aspects of the present disclosure, in particular, provide for process flow simplification and performance optimization by providing an inner spacer adjacent the gate stacks where the inner spacer is air gaps. For GAA devices, an inner spacer with a low dielectric constant may be beneficial to lower the gate to S/D parasitic capacitance to increase operation speed. However, growing epitaxial material adjacent this spacer to the extent that it has a hetero-surface may be disadvantageous. For example, growth along this interface can lead to introducing defects into the epitaxial grown material. In some embodiments herein, the various challenges related to growth of epitaxial source/drain material adjacent dielectric material (e.g., oxides) inner spacers is avoided as the spacers are formed after the source/drain and additionally, air gaps are positioned where an inner spacer may have been formed in other embodiments. Avoiding defects in the epitaxial material can provide an improved stain efficiency of the source/drain region thereby increasing device performance. The process of forming air gaps between the gate and source/drain including as discussed above can also be implemented to provide for process control as the width of the air gap inner spacers is controlled by wire release etching (block 124). Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a multi-gate semiconductor device including providing a first fin extending above a substrate. The first fin may have a plurality of a first type of epitaxial layers and a plurality of a second type of epitaxial layers. A first portion of a layer of the second type of epitaxial layers in a channel region of the first fin is removed to form a gap between a first layer of the first type of epitaxial layers and a second layer of the first type of epitaxial layers. A first portion of a first gate structure is formed within the gap and extends from a first surface of the first layer of the first type of epitaxial layers to a second surface of the second layer of the first type of epitaxial layers. After forming the first portion of the first gate structure, a second portion of the layer of the second type of epitaxial layers adjacent the first portion of the first gate structure is removed to form a first air gap.

In an embodiment, the method further includes forming a dummy gate structure over the channel region the first fin, removing a source/drain region of the first fin to form an opening adjacent the dummy gate structure, and forming a source/drain feature in the opening. The source/drain feature may interface the second portion of the layer of the second type of epitaxial layers. In another embodiment, the method further includes forming a dummy gate structure over the channel region the first fin, forming a first spacer element adjacent the dummy gate structure, and after forming the first portion of the first gate structure and prior to removing the second portion of the layer of the second type of epitaxial layers, removing the first spacer element to form a second air gap. In a further embodiment, the method includes forming a seal layer over the second air gap. The seal layer formation may include depositing a dielectric layer over the second air gap and interfacing the first gate structure. In a further embodiment, the seal layer has a top surface coplanar with a top surface of the first gate structure, and the seal layer has a bottom surface interfacing the second air gap.

In an embodiment, the method also includes forming an epitaxial source/drain element. The first air gap interfaces the epitaxial source/drain element. In an embodiment, forming the epitaxial source/drain element is performed prior to the removing the first portion of the layer of the second type of epitaxial layers. In an embodiment, forming the epitaxial source/drain element includes epitaxially growing a first layer of epitaxial material having a first composition and epitaxially growing a second layer of epitaxial material having a second composition, the first and second compositions being different. In a further embodiment, the first composition includes silicon with a first dopant type and the second composition includes silicon germanium with the first dopant type. In another embodiment, the method of providing the first fin includes epitaxially growing the first type of epitaxial layers by growing a silicon layer; and epitaxially growing the second type of epitaxial layers by growing a silicon germanium layer.

In another of the broader embodiments discussed herein, a method of fabricating a semiconductor device is provided that includes forming a first fin including a first silicon layer and a second silicon layer and forming a silicon germanium (SiGe) layer interposing the first and second silicon layers. The method continues to include removing a first portion of the first fin to form a trench. A source/drain feature is epitaxially grown in the trench, wherein the source/drain feature interfaces the first silicon layer, the second silicon layer, and the SiGe layer. A first portion of the SiGe layer is removed to provide an opening between the first and second silicon layers in a channel region. A first portion of a gate structure is then formed in the opening between the first and second silicon layers in the channel region. After forming the gate structure, the method includes removing a second portion of the SiGe layer to provide an air gap between the first and second silicon layers in a source/drain region. The air gap interfaces the source/drain feature and the first and second silicon layers.

In a further embodiment, the removing the second portion of the SiGe layer is performed through a second opening adjacent the gate structure. In an embodiment, the second opening is formed by removing a spacer element abutting a second portion of the gate structure. The second portion of the gate structure is disposed above the first and second silicon layers and above the first portion of the gate structure. In an embodiment, the method further includes forming a seal layer over the second opening adjacent the second portion of the gate structure to form another air gap adjacent the second portion of the gate structure. In a further embodiment, the forming the source/drain feature includes growing a first layer including silicon and a second layer including silicon germanium.

In another of the broader embodiments, a multi-gate semiconductor device includes a first fin element including a plurality of silicon layers a first gate structure over a channel region of the first fin element, an air gap disposed on a sidewall of the portion of the first gate structure, and an epitaxial source/drain feature abutting the air gap. A portion of the first gate structure is disposed between first and second layers of the plurality of silicon layers.

In a further embodiment, another air gap is adjacent a second portion of the first gate structure. The another air gap is above each of the plurality of silicon layers. A dielectric seal layer may be disposed over the another air gap. The air gap abuts a first layer of the epitaxial source/drain feature, the epitaxial source/drain feature including the first layer and a second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a multi-gate semiconductor device, comprising:

forming a fin element including a plurality of a first type of epitaxial layers and a plurality of a second type of epitaxial layers;

selectively removing a first portion of a layer of the second type of epitaxial layers in a channel region of the fin element to form a gap between a first layer of the first type of epitaxial layers and an adjacent second layer of the first type of epitaxial layers;

forming a first part of a gate structure within the gap and a second part of the gate structure above the plurality of the first type of epitaxial layers, the first part of the gate structure spaced a distance from a source/drain feature, and the second part of the gate structure including an adjacent spacer element;

after forming the first and second parts of the gate structure, removing the adjacent spacer element to form a first air gap adjacent to the second part of the gate structure; and forming a seal layer over the first air gap, wherein the seal layer has a top surface coplanar with a top surface of the gate structure, and wherein the seal layer has a bottom surface interfacing the first air gap.

2. The method of claim 1, wherein the gap extends from a first surface of the first layer of the first type of epitaxial layers to the bottom surface of the seal layer.

3. The method of claim 1, further comprising:
after removing the adjacent spacer element, etching a second portion of the layer of the second type of epitaxial layers adjacent the first part of the gate structure to form a second air gap.

4. The method of claim 3, wherein the second air gap interfaces the source/drain feature.

5. The method of claim 3, wherein the second air gap provides an inner spacer for the multi-gate semiconductor device.

6. The method of claim 3, wherein the distance the first part of the gate structure is spaced from the source/drain feature is substantially equal to a width of the second air gap.

7. The method of claim 1, further comprising:
prior to selectively removing the first portion of the layer of the second type of epitaxial layers, forming the source/drain feature adjacent to the channel region, wherein when formed the source/drain feature interfaces a second portion of the layer of the second type of epitaxial layers.

8. The method of claim 1, wherein the forming the seal layer includes depositing a dielectric layer.

9. The method of claim 1, wherein the first type of epitaxial layers includes silicon and wherein the second type of epitaxial layers includes silicon germanium.

10. The method of claim 1, wherein the removing the adjacent spacer element exposes a gate dielectric layer, and wherein the air gap interfaces the exposed gate dielectric layer after the seal layer is formed.

11. The method of claim 1, wherein the forming the seal layer includes depositing dielectric material over a top surface of the gate structure; and planarizing the dielectric material to form the top surface coplanar with the top surface of the gate structure.

12. A method of fabricating a semiconductor device, comprising:
forming a fin including a silicon germanium (SiGe) layer between a first silicon layer and a second silicon layer within a channel region of the fin;
epitaxially growing a source/drain feature adjacent to the channel region;

removing a first portion of the SiGe layer within the channel region to provide a first opening between the first and second silicon layers;

forming a first portion of a gate structure in the first opening between the first and second silicon layers and a second portion of the gate structure above the first and second silicon layers, wherein the first portion of the gate structure is spaced a distance from the source/drain feature, and wherein the second portion of the gate structure includes a sidewall spacer disposed on a lateral sidewall of the second portion of the gate structure;

after forming the first and second portions of the gate structure, removing the sidewall spacer from the lateral sidewall of the second portion of the gate structure to form a second opening adjacent to the second portion of the gate structure; and capping the second opening with a dielectric seal layer to form a first air gap adjacent to the second portion of the gate structure, wherein the first air gap after the capping extends from the first silicon layer to bottom surface of the dielectric seal layer.

13. The method of claim 12, further comprising:
after removing the sidewall spacer from the lateral sidewall of the second portion of the gate structure, and prior to capping the second opening with the dielectric seal layer, removing a second portion of the SiGe layer adjacent the first portion of the gate structure to form a second air gap.

14. The method of claim 13, wherein the removing the second portion of the SiGe layer is performed through the second opening adjacent to the second portion of the gate structure.

15. The method of claim 13, wherein the second air gap interfaces the source/drain feature and the first and second silicon layers.

16. The method of claim 12, wherein the epitaxially growing the source/drain feature includes growing a first portion including silicon and a second portion including silicon germanium.

17. A method of fabricating a multi-gate semiconductor device, comprising:
a plurality of epitaxial channel layers suspended over a substrate;
forming a gate structure surrounding each of the plurality of epitaxial channel layers, wherein a first portion of the gate structure is disposed between first and second layers of the plurality of epitaxial channel layers, and wherein a second portion of the gate structure is disposed above the plurality of epitaxial channel layers and above the first portion of the gate structure;
providing a first air gap disposed on a sidewall of the second portion of the gate structure and above the plurality of epitaxial channel layers, wherein the providing the first air gap includes:
removing a first spacer element on a sidewall of the second portion of the gate structure to form the first air gap,
depositing a seal layer material over the first air gap and over the gate structure,
planarizing the seal layer material to remove the seal layer material from over the gate structure, wherein the planarized seal layer material interfaces a top of the first air gap; and
growing an epitaxial source/drain feature abutting the plurality of epitaxial channel layers and spaced a distance from the first portion of the gate structure.

18. The method of claim 17, wherein the providing the first air gap also provides a second air gap interposing the epitaxial source/drain feature and the first portion of the gate structure.

19. The method of claim 17, wherein the growing the epitaxial source/drain feature is performed prior to the forming the gate structure.

20. The method of claim 17, wherein the forming the first air gap includes forming the first air gap extending to the first layer of the plurality of epitaxial channel layers.

* * * * *